(12) United States Patent
Komatsu et al.

(10) Patent No.: US 11,482,287 B2
(45) Date of Patent: Oct. 25, 2022

(54) MEMORY SYSTEM AND METHOD OF CONTROLLING MEMORY SYSTEM

(71) Applicant: Kioxia Corporation, Tokyo (JP)

(72) Inventors: Yuki Komatsu, Kawasaki Kanagawa (JP); Katsuyuki Shimada, Ota Tokyo (JP)

(73) Assignee: KIOXIA CORPORATION, Tokyo (JP)

( * ) Notice: Subject to any disclaimer, the term of this patent is extended or adjusted under 35 U.S.C. 154(b) by 57 days.

(21) Appl. No.: 17/191,331

(22) Filed: Mar. 3, 2021

(65) Prior Publication Data

US 2022/0093181 A1   Mar. 24, 2022

(30) Foreign Application Priority Data

Sep. 18, 2020   (JP) .............................. JP2020-157074

(51) Int. Cl.
| | |
|---|---|
| *G11C 7/00* | (2006.01) |
| *G11C 16/26* | (2006.01) |
| *G11C 16/34* | (2006.01) |
| *G11C 16/04* | (2006.01) |
| *G11C 11/56* | (2006.01) |

(52) U.S. Cl.
CPC .......... *G11C 16/26* (2013.01); *G11C 16/0483* (2013.01); *G11C 16/349* (2013.01); *G11C 11/5621* (2013.01)

(58) Field of Classification Search
CPC ....... G11C 7/1051; G11C 7/22; G11C 7/1072; G11C 7/1006; G11C 7/1066
USPC ..................................................... 365/189.15
See application file for complete search history.

(56) References Cited

U.S. PATENT DOCUMENTS

| | | | |
|---|---|---|---|
| 7,340,359 B2 * | 3/2008 | Erez ................. | G11C 29/56008 700/121 |
| 8,879,325 B1 | 11/2014 | Bar et al. | |
| 9,251,909 B1 | 2/2016 | Camp et al. | |
| 9,431,118 B1 | 8/2016 | Bar et al. | |
| 2011/0320688 A1 * | 12/2011 | Lee ..................... | G06F 12/0246 711/E12.008 |
| 2018/0268891 A1 | 9/2018 | Li et al. | |
| 2019/0348133 A1 | 11/2019 | Chen et al. | |

FOREIGN PATENT DOCUMENTS

JP          2018-156696 A    10/2018

* cited by examiner

*Primary Examiner* — Son T Dinh
(74) *Attorney, Agent, or Firm* — Foley & Lardner LLP

(57) ABSTRACT

A memory system includes a memory and a controller. The memory includes at least a first memory cell and a second memory cell. The controller can determine a first stress type that the first memory cell received or a second stress type that the second memory cell received based on a change amount between a first read threshold voltage to read data from the first memory cell when having received stress, and a second read threshold voltage to read data from the first memory cell when having received no stress.

18 Claims, 15 Drawing Sheets

FIG. 5

| Page | Er | A | B | C | D | E | F | G | H | I | J | K | L | M | N | O |
|---|---|---|---|---|---|---|---|---|---|---|---|---|---|---|---|---|
| Top | 1 | 1 | 1 | 1 | 1 | 0 | 0 | 0 | 0 | 0 | 1 | 1 | 0 | 0 | 0 | 1 |
| Upper | 1 | 1 | 0 | 0 | 0 | 0 | 0 | 0 | 1 | 1 | 1 | 1 | 1 | 1 | 0 | 0 |
| Middle | 1 | 1 | 1 | 0 | 0 | 0 | 0 | 1 | 1 | 0 | 0 | 0 | 0 | 1 | 1 | 1 |
| Lower | 1 | 0 | 0 | 0 | 1 | 1 | 0 | 0 | 0 | 0 | 0 | 1 | 1 | 1 | 1 | 1 |

FIG. 8

| chip | Block | WLSC | DR | P/E | RD | Level | Initial Vth | Actual Vth |
|---|---|---|---|---|---|---|---|---|
| 106 | 1012 | 0 | 1year | 0 | 0 | A | 36 | 19 |
| 106 | 1012 | 0 | 1year | 0 | 0 | B | 95 | 80 |
| 106 | 1012 | 0 | 1year | 0 | 0 | C | 152 | 133 |
| ... | ... | ... | ... | ... | ... | ... | ... | ... |
| 109 | 99 | 384 | None | 1900 | 10000 | O | 414 | 435 |

| WLSC | VA | VB | VC | VD | VE | VF | VG | VH | VI | VJ | VK | VL | VM | VN | VO | TBL1 |
|---|---|---|---|---|---|---|---|---|---|---|---|---|---|---|---|---|
| 0 | -4 | 17 | 11 | -3 | 2 | -1 | -1 | -8 | -7 | -17 | -17 | -13 | -22 | -27 | -24 | |
| 1 | -5 | 16 | 11 | -3 | 2 | -1 | -1 | -8 | -7 | -17 | -17 | -13 | -22 | -26 | -24 | |
| ... | | | | | | | | | | | | | | | | |
| 95 | -2 | 9 | 4 | -4 | 1 | 0 | 0 | -7 | -2 | -8 | -10 | -9 | -13 | -19 | -17 | |
| ... | | | | | | | | | | | | | | | | |
| 383 | -29 | -10 | -12 | -20 | -17 | -15 | -18 | -25 | -21 | -28 | -27 | -24 | -27 | -32 | -29 | |

Shift[Level]

FIG. 13
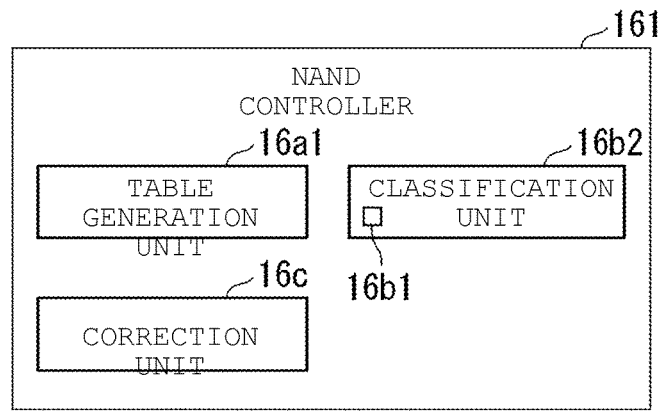
FIG. 14
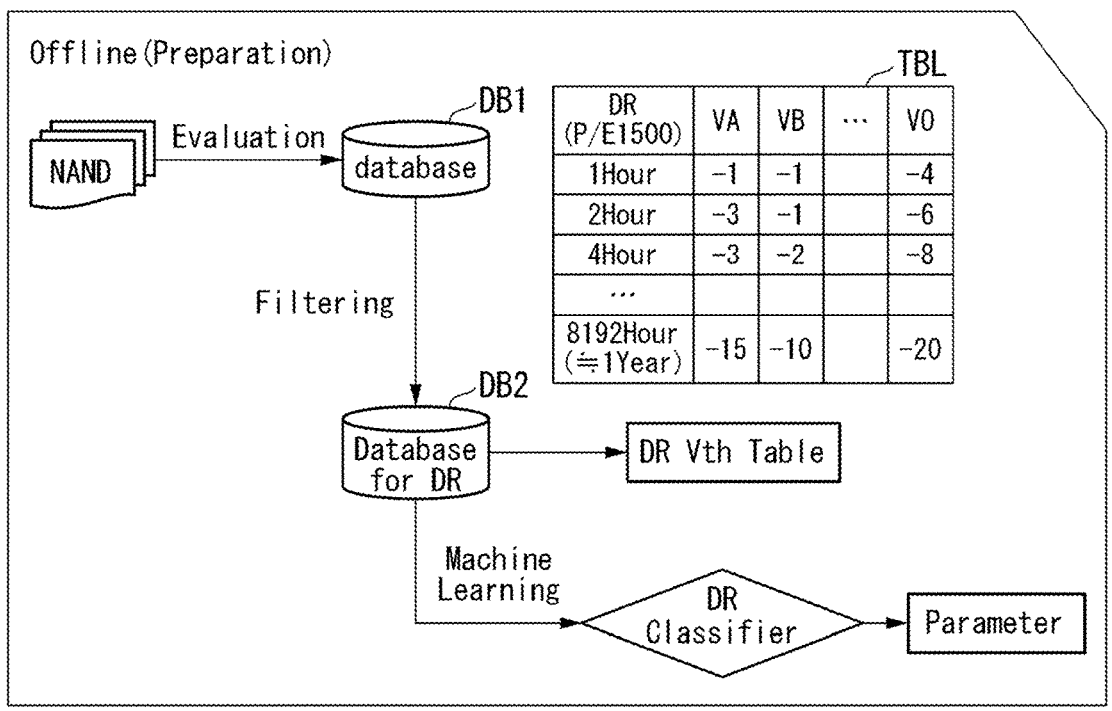
FIG. 15
| | V [Level] | | | | | | | | |
|---|---|---|---|---|---|---|---|---|---|
| | VAD | VBD | VCD | VDD | VED | VFD | VGD | ... | VOD |
| REFERENCE VALUE | 25 | 84 | 138 | 195 | 258 | 322 | 392 | ... | 1022 |

| Codebook Index | ΔV [Level] | | | | | | | | |
|---|---|---|---|---|---|---|---|---|---|
| | A | B | C | D | E | F | G | ... | 0 |
| 0 | 0 | 0 | 0 | 0 | 0 | 0 | 0 | | 0 |
| 1 | 0 | 1 | −1 | −1 | 0 | 0 | 0 | | −1 |
| 2 | 0 | −1 | −1 | 0 | −2 | −1 | −1 | | −2 |
| 3 | 2 | −1 | −1 | 0 | −1 | 1 | −2 | ... | −2 |
| ⋮ | ⋮ | ⋮ | ⋮ | ⋮ | ⋮ | ⋮ | ⋮ | | ⋮ |
| m | 2 | −5 | −7 | −10 | −12 | −14 | −17 | | −23 |

| Group Index | Block Kind | Block Number | Codebook Index |
|---|---|---|---|
| 0 | Reference | 0 | n |
| | Difference | 1 | 2 |
| | Difference | 2 | 1 |
| | ⋮ | | |
| | Difference | 31 | 2 |
| 1 | Reference | 32 | m |
| | Difference | 33 | 2 |
| | ⋮ | | |
| ⋮ | ⋮ | ⋮ | ⋮ |

| Row Index | ΔV [Level] | | | | | | | | |
| | A | B | C | D | E | F | G | ⋯ | O |
|---|---|---|---|---|---|---|---|---|---|
| 0 | 10 | 12 | 12 | 12 | 15 | 16 | 11 | | 20 |
| 1 | 9 | 11 | 12 | 12 | 13 | 14 | 11 | | 13 |
| 2 | 8 | 9 | 10 | 9 | 11 | 12 | 9 | | 9 |
| ⋮ | ⋮ | ⋮ | ⋮ | ⋮ | ⋮ | ⋮ | ⋮ | ⋯ | ⋮ |
| 127 | 0 | 0 | 0 | 0 | 0 | 0 | 0 | | 0 |
| ⋮ | ⋮ | ⋮ | ⋮ | ⋮ | ⋮ | ⋮ | ⋮ | | ⋮ |
| m | −10 | −5 | −6 | −8 | −10 | −20 | −10 | | −12 |

METHOD OF ACQUIRING DETERMINATION VOLTAGE OF REFERENCE BLOCK

|  | VAD | VBD | VCD | VDD | VED | VFD | VGD | ... | VOD |
|---|---|---|---|---|---|---|---|---|---|
| REFERENCE VALUE | 25 | 84 | 138 | 195 | 258 | 322 | 392 | ... | 1022 |

| Codebook Index | A | B | C | D | E | F | G | ... | O |
|---|---|---|---|---|---|---|---|---|---|
| m | 2 | -5 | -7 | -10 | -12 | -14 | -17 | ... | -23 |

+

| Row Index | A | B | C | D | E | F | G | ... | O |
|---|---|---|---|---|---|---|---|---|---|
| 0 | 10 | 12 | 12 | 12 | 15 | 16 | 11 | ... | 20 |

⇩

|  | A | B | C | D | E | F | G | ... | O |
|---|---|---|---|---|---|---|---|---|---|
| DETERMINATION VOLTAGE AFTER CORRECTION | 37 | 91 | 143 | 197 | 261 | 324 | 386 | ... | 1019 |

MEMORY SYSTEM AND METHOD OF CONTROLLING MEMORY SYSTEM

CROSS-REFERENCE TO RELATED APPLICATION

This application is based upon and claims the benefit of priority from Japanese Patent Application No. 2020-157074, filed on Sep. 18, 2020, the entire contents of which are incorporated herein by reference.

FIELD

Embodiments described herein relate generally to a memory system and a method of controlling the memory system.

BACKGROUND

A memory system generally includes a NAND flash memory including a plurality of memory cells. In the memory system, reading data is performed by applying a determination voltage to word lines connected to target memory cells being read. When a value of the determination voltage is offset, data may be erroneously determined.

DESCRIPTION OF THE DRAWINGS

FIG. 5 is a diagram illustrating data corresponding to the threshold voltage distribution according to the first embodiment.

FIG. 8 is a diagram illustrating an example of a database according to the first embodiment.

FIG. 9 is a diagram illustrating an example of a data table according to the first embodiment.

FIG. 13 is a diagram illustrating a configuration of a NAND controller according to a second embodiment.

FIG. 14 is a diagram illustrating an overview of a process performed by a memory system according to the second embodiment.

FIG. 15 is a diagram illustrating an example of reference voltage information according to the second embodiment.

FIG. 18 is a diagram illustrating an example of block management information according to the second embodiment.

FIG. 19 is a diagram illustrating an example of row difference value information according to the second embodiment.

DETAILED DESCRIPTION

Figure 1:
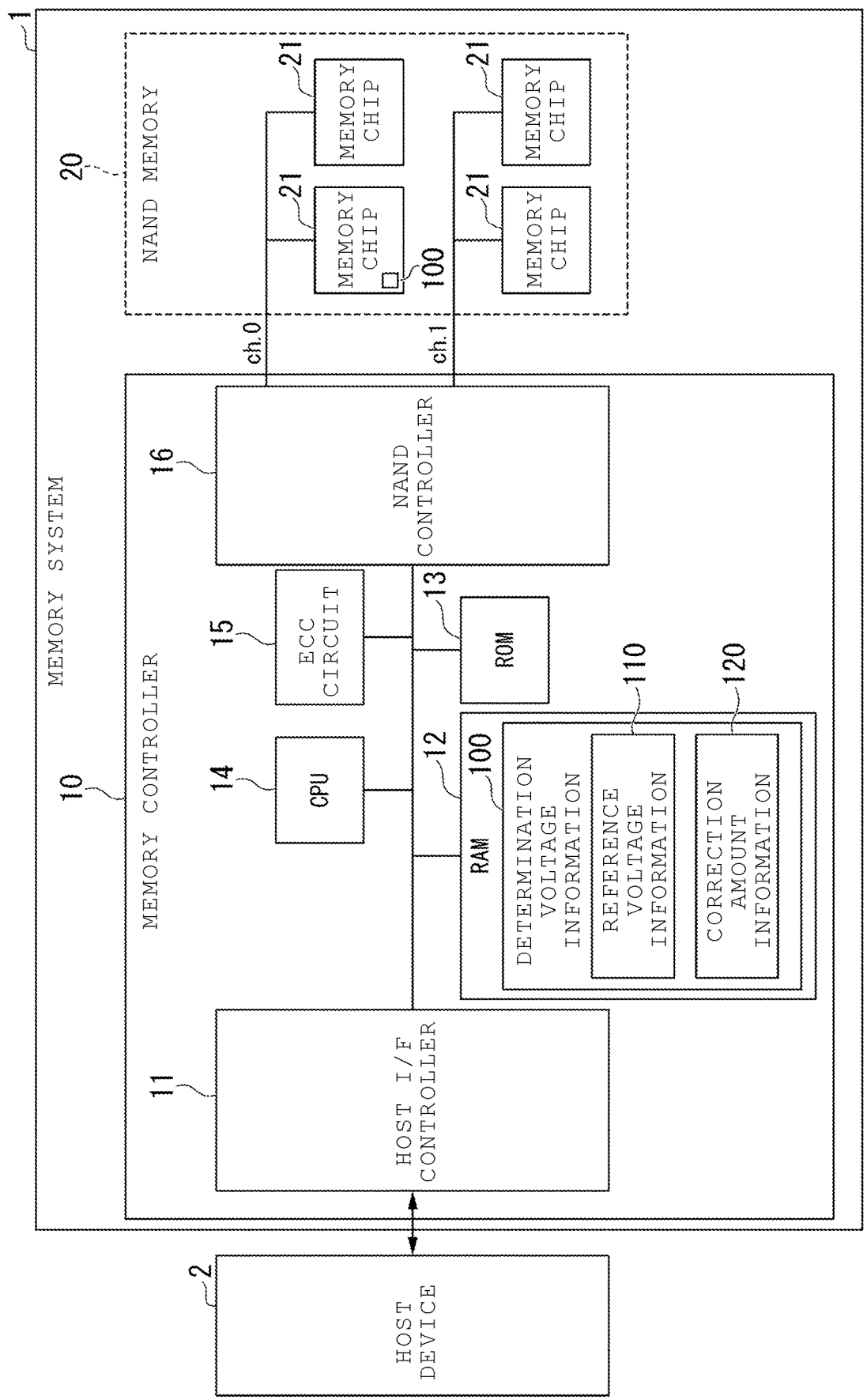
FIG. 1 is a block diagram illustrating a configuration of a memory system according to a first embodiment.

Embodiments provide a memory system and a method of controlling the memory system capable of achieving an improvement of characteristics in data reading.

In general, according to one embodiment, a memory system includes a memory and a controller. The memory includes at least a first memory cell and a second memory cell. The controller can determine a first stress type that the first memory cell received or a second stress type that the second memory cell received based on a change amount between a first read threshold voltage to read data from the first memory cell when having received stress, and a second read threshold voltage to read data from the first memory cell when having received no stress.

Hereinafter, a memory system and a method of controlling the memory system according to embodiments will be described with reference to the drawings. In the following description, the same reference numerals are given to configurations that have similar or same functions. The repeated description of the same configurations will be omitted in some cases. In the present specification, the phrase "based on XX" means a phrase "based on at least XX" and also includes cases based on other elements in addition to XX. The phrase "Based on XX" is not limited to cases in which XX is directly used and includes cases based on calculation or processing performed on XX. "XX" is any element (for example, any information).

In the present specification, the phrase "reading" is referred to as "read" in some cases and the term "writing" is referred to as "write" in some cases. In the present specification, the phrases "writing," "storing," and "preserving" are used as the same meaning in some cases. Therefore, these terms can be replaced with each other. In the present specification, the phrase "connection" is not limited to mechanical connection and includes electrical connection. In the present specification, the phrase "acquiring" is not limited to a case in which information is obtained from the outside and includes calculation by itself. In the present specification, the phrases "each bit line" and "bit line unit" can be replaced with "each row" or "row unit" and are used when a process is performed in each word line string chunk WLSC (unit), that is, each page (unit). In the present specification, a "determination voltage" can be replaced with a "(reading) threshold."

In a memory system including a memory, an appropriate value of a determination voltage used to read data from the memory is changed due to an influence of stress such as a program disturb, a read disturb, or a data retention. The program disturb means that, in a data writing operation, an electric field is generated in a different memory cell (hereinafter referred to as a "non-writing target memory cell") from a data writing target memory cell and an amount of charge stored in the non-writing target memory cell is changed (for example, charges increase) because of an influence of the electric field. The read disturb means that, in a data reading operation, an electric field is generated in a different memory cell (hereinafter referred to as a "non-reading target memory cell") from a data reading target memory cell and an amount of charge stored in the non-reading target memory cell is changed (for example, charges increase) because of an influence of the electric field. The data retention means that an amount of charge stored in a memory cell is changed (for example, charges decrease) because of an influence over time. That is, the stress corresponds to a change in a storage state of the memory cell (a change in an amount of charge stored in the memory cell). The "appropriate value" is not limited to an optimum value and may be a value at which a reading error does not occur.

Accordingly, a memory system according to embodiments estimates stress from a change in a storage state of a memory cell in a certain physical block (for example, a change in a determination voltage). The memory system corrects the determination voltage in accordance with the estimated stress.

First Embodiment

<1. Overall Configuration of Memory System>

FIG. 1 a block diagram illustrating a configuration of a memory system 1 according to a first embodiment. The memory system 1 can be connected to a host device 2. The host device 2 is, for example, a sever device, a personal computer, or a mobile information processing device. The memory system 1 functions as an external storage device of the host device 2. The host device 2 can issue an access request (a read request or a write request) to the memory system 1.

The memory system 1 includes a memory controller 10 and a NAND memory 20. The memory controller 10 and the NAND memory 20 are connected by a plurality of channels. The memory controller 10 is an example of a "controller". The NAND memory 20 is an example of a "memory device."

The memory controller 10 includes a host interface controller (host I/F controller) 11, a random access memory (RAM) 12, a read-only memory (ROM) 13, a central processing unit (CPU) 14, an error correcting code (ECC) circuit 15, and a NAND controller 16. These functional units are connected to each other by a bus. For example, the memory controller 10 is configured as a system on a chip (SoC) in which the configurations are incorporated in one chip. Here, some of the functional units may be provided outside of the memory controller 10.

The host I/F controller 11 controls a communication interface between the host device 2 and the memory system 1 and controls data transmission between the host device 2 and the RAM 12 under the control of the CPU 14.

The RAM 12 is, for example, a synchronous dynamic random access memory (SDRAM) or a static random access memory (SRAM), but an embodiment is not limited thereto. The RAM 12 functions as a buffer for data transmission between the host device 2 and the NAND memory 20. The RAM 12 provides a work area to the CPU 14. Firmware (a program) stored in the ROM 13 is loaded to the RAM 12 in an operation of the memory system 1.

In the embodiment, in an operation of the memory system 1, for example, determination voltage information 100 stored in any memory chip 21 in the NAND memory 20 is loaded to the RAM 12. The determination voltage information 100 is setting information used to determine a value of a determined voltage to be applied to each word line WL to be described below in a read operation to the NAND memory 20. The determination voltage information 100 includes reference voltage information 110 and correction amount information 120. The determination voltage information 100 will be described in detail below.

In the embodiment, the memory controller 10 calculates the value of the determination voltage to be applied to each word line WL based on the determination voltage information 100 and instructs the NAND memory 20 to apply the determination voltage with the calculated value. The value of the determination voltage is not calculated by the memory controller 10, and a reference value of the determination voltage is stored in the NAND memory 20 and a difference value (a group difference value, a block difference value, or the like to be described below) from the reference value is instructed from the memory controller 10 to the NAND memory 20 in accordance with the kind of received stress and the value of the determination voltage is calculated and applied by the NAND memory 20.

The CPU 14 is an example of a hardware processor. The CPU 14 controls the memory controller 10, for example, by executing the firmware loaded to the RAM 12. For example, the CPU 14 controls operations related to data writing, reading, and erasing on the NAND memory 20, as will be described below. The plurality of CPUs 14 may be provided and any CPU 14 may be allocated in each operation.

The ECC circuit 15 performs encoding for error correction on writing target data in the NAND memory 20 (hereinafter also referred to as "write data"). The ECC circuit 15 performs error correction on read data based on an error correction code generated in a write operation when an error is contained in data read from the NAND memory 20 (hereinafter also referred to as "read data").

The NAND controller 16 controls each channel (ch. 0 and ch. 1). The NAND controller 16 controls data transmission between the RAM 12 and the NAND memory 20 under the control of the CPU 14.

The NAND memory 20 includes a plurality of (here, four) memory chips 21 serving as nonvolatile semiconductor memories. In the embodiment, the memory controller 10 includes two channels (ch. 0 and ch. 1). The memory controller 10 may include one channel or three or more channels. In the example illustrated in FIG. 1, two memory chips 21 are connected to each channel. Three or more memory chips 21 may be connected to each channel.

Each channel includes an I/O signal line, a control signal line, a chip enable (CE) signal line, and ready (RY)/busy (BY) signal line. The I/O signal line transmits data, an address, and various instructions (commands). The memory controller 10 transmits a read instruction, a write instruction, an erase instruction to the memory chips 21 via the I/O signal line. The control signal line includes a write enable (WE) signal line, a read enable (RE) signal line, a command latch enable (CLE) signal line, an address latch enable (ALE) signal line, and a write protection (WP) signal line. The CE signal line transmits a signal indicating that the memory chips are being selected. The RY/BY signal line indicates whether or not the NAND memory 20 is operating with a level of a signal. For example, the RY/BY signal line indicates a ready state (RY) corresponding to a non-operation with an H level and indicates a busy state (BY) corresponding to an operation with an L level.

<2. Configuration of Memory Chip>

Figure 2:
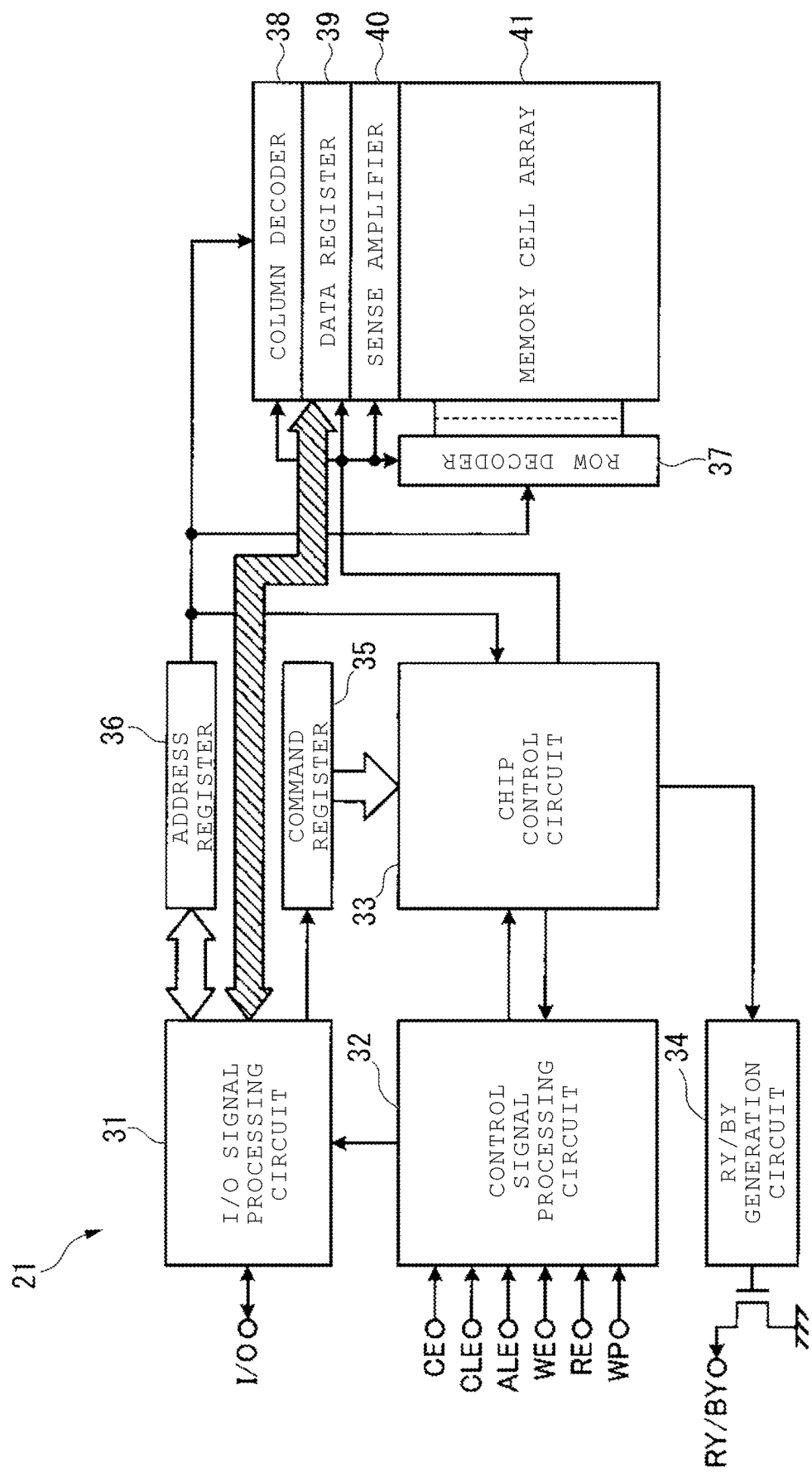
FIG. 2 is a block diagram illustrating a configuration of a memory chip according to the first embodiment.

FIG. 2 is a block diagram illustrating a configuration of the memory chip 21. The memory chip 21 includes, for example, an I/O signal processing circuit 31, a control signal processing circuit 32, a chip control circuit 33, an RY/BY generation circuit 34, a command register 35, an address register 36, a row decoder 37, a column decoder 38, a data register 39, a sense amplifier 40, and a memory cell array 41.

The I/O signal processing circuit 31 is a buffer circuit that transmits and receives an I/O signal between the memory controller 10 and the memory chips 21. Commands latched by the I/O signal processing circuit 31, addresses for designating access destinations, and data are distributed and stored in the command register 35, the address register 36, and the data register 39, respectively.

An address stored in the address register 36 includes a chip number, a row address, and a column address. The chip number is an identification information for distinguishing the memory chips 21. The chip number, the row address, and the column address are read to the chip control circuit 33, the row decoder 37, and the column decoder 38, respectively.

The control signal processing circuit 32 receives a control signal and distributes storage destination registers of the I/O signals received by the I/O signal processing circuit 31 based on the received control signal. The control signal processing circuit 32 transmits the received control signal to the chip control circuit 33.

The chip control circuit 33 is a circuit that performs state transition based on various control signals received via the control signal processing circuit 32. The chip control circuit 33 controls an operation of the memory chips 21. The RY/BY generation circuit 34 causes a state of the RY/BY signal line to transition between a ready state (RY) and a busy state (BY) under the control of the chip control circuit 33.

The sense amplifier 40 senses a state of a memory cell MT (see FIG. 3) in the memory cell array 41 and generates read data based on a sensed state in a read operation. The sense amplifier 40 stores the generated read data in the data register 39. The read data stored in the data register 39 is transmitted to the I/O signal processing circuit 31 via the data line and is transmitted from the I/O signal processing circuit 31 to the memory controller 10.

The memory cell array 41 includes a plurality of memory cells MT and stores data. Specifically, the memory cell array 41 includes a plurality of physical blocks BLK (see FIG. 3). Each physical block BLK includes a plurality of memory cells MT. The physical block BLK is a minimum unit of data erasing. That is, all the data stored in one physical block BLK are erased collectively. Hereinafter, the "physical block" is simply referred to as a "block."

<3. Configuration of Memory Cell Array>

Figure 3:
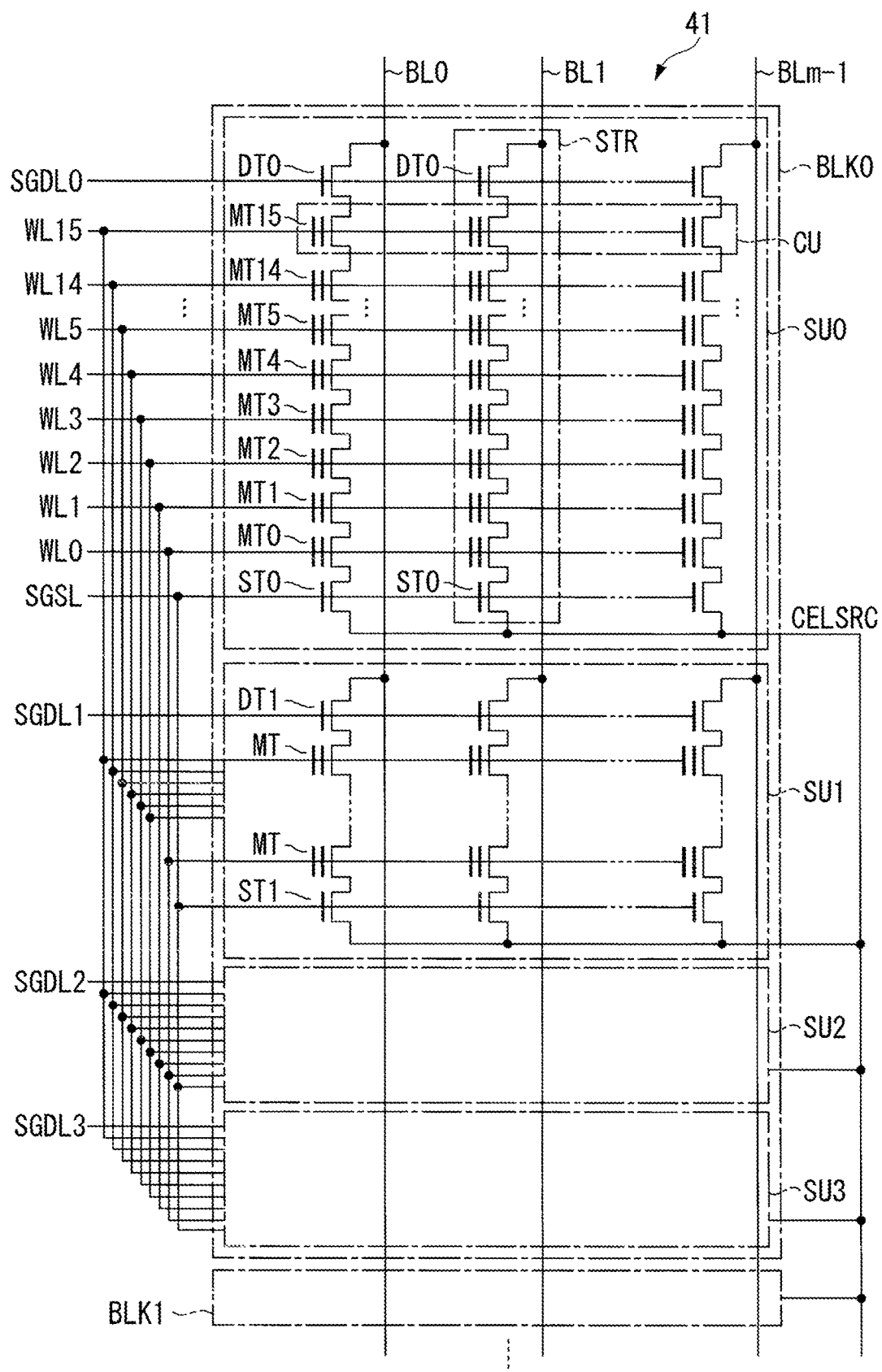
FIG. 3 is a diagram illustrating an example of a part of a configuration of a memory cell array according to the first embodiment.

FIG. 3 is a diagram illustrating an example of a part of a configuration of the memory cell array 41. The memory cell array 41 is, for example, a NAND memory that has a so-called 3-dimensional structure in which the plurality of memory cells MT are disposed in a 3-dimensional shape. The memory cell array 41 includes a plurality of blocks BLK (BLK0, BLK1, . . . ). For example, the memory cell array 41 includes hundreds to thousands of blocks BLK.

As illustrated in FIG. 3, each of m (where m is a natural number) bit lines BL (BL0 to BLm−1) is connected to a plurality of (for example, four) strings STR in each block BLK. Each string STR includes one first select gate transistor ST (ST0 to ST3), a plurality of memory cells MT (MT0 to MT15), and one second select gate transistor DT (DT0 to DT3). The first select gate transistor ST, the plurality of memory cells MT, and the second select gate transistor DT are connected in series in this order between a source line CELSRC and one bit line BL. The plurality of (m) strings STR connected to the plurality of different bit lines BL (BL0 to BLm−1) form one string unit SU. Each block BLK includes a plurality of (for example, four) string units SU (SU0 to SU3).

A control gate electrode of the first select gate transistor ST is connected to a first select gate line (a source-side select gate line) SGSL. The first select gate line SGSL is a control signal line for controlling the control gate electrode of the first select gate transistor ST. The first select gate transistor ST is selectively connected between the plurality of memory cells MT and the source line CELSRC based on a voltage applied through the first select gate line SGSL. The first select gate line SGSL may be connected independently for each string unit SU (SU0 to SU3).

A control gate electrode of the second select gate transistor DT is connected to a second select gate line (drain-side select gate line) SGDL (SGDL0 to SGDL3). The second select gate line SGDL is a control signal line for controlling the control gate electrode of the second select gate transistor DT. The second select gate transistor DT is selectively connected between the plurality of memory cells MT and the bit line BL based on a voltage applied through the second select gate line SGDL.

Each memory cell (memory cell transistor) MT is configured as a metal oxide semiconductor field effect transistor (MOSFET) that has a stacked gate structure. The stacked gate structure includes, for example, a floating gate formed via a tunnel oxide film interposed and a control gate electrode formed on the floating gate via a gate insulating film. A threshold voltage of the memory cell MT changes in accordance with the number of charges stored in the floating gate. In the memory cell MT, positive charges are injected to the floating gate by writing and positive charges are extracted from the floating gate for erasing. In each memory cell MT, any one of two or more data values may be written. Each memory cell MT stores one of one or more data values in a nonvolatile manner according to a difference in the threshold voltage.

In each block BLK, the control gate electrode of each memory cell MT is connected to each corresponding word line WL. For example, the word lines WL0 to WL15 are connected to the control gate electrodes of the memory cells MT0 to MT15, respectively. Each word line WL is a control signal line for selecting the memory cells MT of one group arranged in one line (one row) in the memory cell array 41 and is commonly connected to the memory cells MT of one group arranged in one line. Each memory cell MT is provided in each of intersections between the word line WL and the bit lines BL (BL0 to BLm−1). Reading or writing of the memory cell MT is possible by applying a certain voltage to the word line WL connected to the memory cell MT performing reading or writing (hereinafter also referred to as a "selected word line WL"). The reading and writing of the memory cell MT will be described later.

In each block BLK, the word lines WL corresponding to the same address are commonly connected to the plurality of memory cells MT in the different strings STR. A set including the plurality of memory cells MT sharing the word line WL is referred to as a cell unit CU. For the plurality of memory cells MT in one cell unit CU, data is written collectively or data is read collectively. A storage space of one cell unit CU includes one page or a plurality of pages.

The memory system 1 can store values of a plurality of bits in each memory cell MT. For example, when each memory cell MT can store values of n (where n≥2) bits, a storage capacity per word line WL is equal to a size corresponding to n pages. Here, for example, each memory cell MT operating in a quad-level cell (QLC) mode that stores 4-bit values will be described.

In a quad-level cell (QLC) mode, data corresponding to four pages may be stored in each word line WL. Of the four pages formed by one word line WL, a page in which writing is first performed is referred to as a lower page, a page in which writing is performed after the lower page is referred to as a middle page, and a page in which writing is performed after the middle page is referred to as an upper page. A page in which writing is performed finally after the upper page is referred to as a top page. A mode in which a program (that is, writing) is performed collectively in some or all of the plurality of pages formed by one word line WL may be provided.

<4. Threshold Voltage Distribution of Memory Cell>

Figure 4:
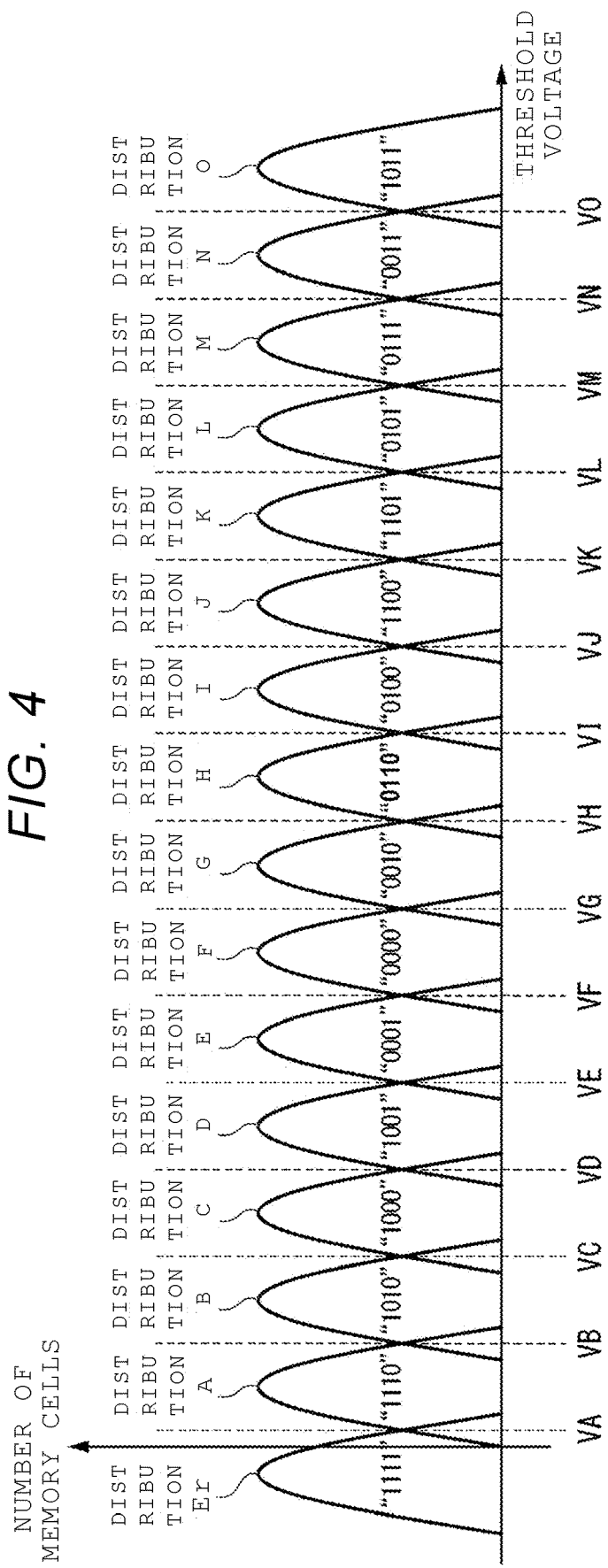
FIG. 4 is a diagram illustrating a threshold voltage distribution of memory cells according to the first embodiment.

FIG. 4 is a diagram illustrating a threshold voltage distribution of the memory cells MT. FIG. 5 is a diagram illustrating data corresponding to the threshold voltage distribution illustrated in FIG. 4. In FIG. 4, the horizontal axis represents a threshold voltage of the memory cell MT and the vertical axis represents the number of memory cells MT indicating a certain bit value (data value). When each memory cell MT operates in the quad-level cell (QLC) mode, the threshold voltage distribution of the memory cells MT includes 16 lobs, as illustrated in FIG. 4.

In the quad-level cell (QLC) mode, each memory cell MT can store hexadecimal data "wxyz" defined using data "w" belonging to the top page, data "x" belonging to the upper page, data "y" belonging to the middle page, and data "z" belonging to the lower page. Values of the data "w," the data "x," the data "y," and the data "z" are code "0" or code "1."

The threshold voltage of each memory cell MT is controlled so that the threshold voltage belongs to one of 16 groups of distributions Er, A, B, C, D, E, F, G, H, I, J, K, L, M, N, and O). As illustrated in FIG. 5, correspondence between each distribution and the hexadecimal data value "wzyz" is set in advance. For example, a data value "1111" is allocated to the distribution Er. A data value "1110" is allocated to the distribution A. Each data value illustrated in FIG. 5 is allocated to each of the distributions B to O. The correspondence between the distributions and the data values is not limited to the above correspondence.

Here, the row decoder 37, the column decoder 38, the data register 39, and the sense amplifier 40 of the NAND memory 20 will be described complementarily with reference to FIG. 2. The row decoder 37, the column decoder 38, the data register 39, and the sense amplifier 40 are some of peripheral circuits in the memory cell array 41. The peripheral circuits perform access (reading, writing, and erasing) on the memory cell array 41 under the control of the chip control circuit 33.

For example, in a writing operation, the column decoder 38 selects and activates a bit line BL corresponding to a column address. The sense amplifier 40 sets a potential of the bit line BL selected by the column decoder 38 to 0 volts. The row decoder 37 applies a programming pulse (that is, a pulse of which voltage gradually increases per cycle) to a word line WL corresponding to the row address. Thus, charges are injected to the floating gate of the memory cell MT located at an intersection between the selected bit line BL and the selected word line WL. As a result, the threshold voltage of the floating gate increases. At each cycle of the programming pulse, the sense amplifier 40 checks whether or not the threshold voltage of the writing target memory cell MT reaches a voltage in accordance with the data stored in the data register 39. In accordance with a checking result by the sense amplifier 40, the row decoder 37 continues to apply the programming pulse until the threshold voltage of the memory cell MT reaches a voltage in accordance with a data value to be written.

On the other hand, in a reading operation, the sense amplifier 40 precharges a power potential Vcc to the bit line BL. The row decoder 37 sequentially applies a plurality of determination potentials (threshold determination voltages or read voltages) for specifying distributions of the data values (e.g., "1111," "1110," "1010," "1000," "1001," "0001," "0000," "0010," "0110," "0100," "1100," "1101," "0101," "0111," "0011," and "1011") to the selected word lines WL. The row decoder 37 applies a transmission potential to an unselected word line WL so that the memory cell MT belonging to the unselected word line WL is in a conductive state. The sense amplifier 40 determines a data value stored in the target memory cell MT by detecting whether or not the charges stored by the precharging flow out to the source line CELSRC when a certain determination voltage is applied.

For example, as illustrated in FIG. 4, when a determination voltage VA is set between the distributions Er and A, the memory cell MT with a threshold voltage less than the determination voltage VA is determined to be in the distribution Er. When a determination voltage VB is set between the distributions A and B, the memory cell MT with a threshold voltage less than the determination voltage VB is determined to be in the distribution A. Similarly, as illustrated in FIG. 4, the memory cell MT in which a determination voltage is set between two adjacent distributions and which has a threshold voltage less than the determination voltage is determined to be in a distribution lower than the threshold voltage between two distributions. Hereinafter, when the determination voltages VA to VO are not distinguished, the determination voltages VA to VO are simply referred to as the "determination voltages V."

The correspondence between the distributions and the data values is not limited to the above-described correspondence illustrated in FIG. 4. When each data value differs, the data values may be distributed in an ascending order of the threshold voltages and a certain data value order. For example, the data values "1011," "0011," "0111," "0101," "1101," "1100," "0100," "0110," "0010," "0000," "0001," "1001," "1000," "1010," "1110," and "1111" are distributed in an ascending order of the threshold voltages. The row decoder 37 may sequentially apply the plurality of determination potentials (threshold determination voltages or read voltages) for specifying distributions of the data values ("1011," "0011," "0111," "0101," "1101," "1100," "0100," "0110," "0010," "0000," "0001," "1001," "1000," "1010," "1110," and "1111") to the selected word line WL.

<5. Management of Determination Voltage>

Next, management of the determination voltage V will be described. An appropriate value of the determination voltage V differs for each block BLK and differs for each word line WL even in the same block BLK. Further, the appropriate value of the determination voltage V changes due to an influence of stress such as a program disturb, a read disturb, or data retention. Therefore, the setting information of the determination voltage V in which a latest appropriate value is reflected is stored individually for each word line WL.

In the embodiment, the setting information of the determination voltage V may be stored with a relatively small storage capacity by estimating stress through a process to be described below every plurality of word lines WL and compressing the setting information of the determination voltage V corresponding to the estimated stress.

For example, in the embodiment, the compressing of the setting information of the determination voltage V is implemented using a modified median-cut vector quantization (MMCVQ) algorithm (see U.S. Pat. Nos. 9,431,118 and 8,879,325). For example, the compressing of the setting information of the determination voltage V starts from a stage in which a first partition of a multidimensional space (nD) including all the determination voltages V in a database T is performed. Each determination voltage V is expressed as a point in the multidimensional space. This stage includes defining a first node of a tree V1 as V1={Tk; k=1:P} and calculating a determination point in a determination region of the database T in accordance with a determination point reference (reference I). This stage also includes resetting an index I to 1. Subsequently, a stage in which a plurality of repetitions are performed for an index i from 1 to M−1 continues. The stage in which the plurality of repetitions are performed includes a stage in which the index i is equal to M and a stage in which the index i increases by 1. In the stage in which the plurality of repetitions are performed, a determination region is first selected for cutting in accordance with several determination region references (reference II). The determination region is represented by Vj. Here, j takes a value equal to or greater than 1 and equal to or less than I. Subsequently, the determination region Vj is cut by a dimension q. Here, q takes a value equal to or greater than 1 and equal to or less than 15. This makes a best division dimension (reference III) as a division point (reference IV) of a determination region cluster point in a q-th dimension. Subsequently, two new regions (subsets of the multidimensional space) obtained through the cutting are indicated by U1 and U2. Here, Vi+1=U1 and Vi+2=U2. Subsequently, a determination point continuing from the determination point reference I is calculated in a new determination region. A subsequent stage includes removing Vj from a list of the determination regions and decreasing an index of all the determination regions from j+1 to i. The reference I can be defined not only as at least one average but also as a median, or an average or a median of a specific dimension, a certain point between ends of a long side, or others. The reference II is the number of points in the determination region, a volume of the determination region, a total number, a maximum value, or an average of errors of the points in the determination region, an increase in the total number of errors of the points in the determination region, an increase in the maximum number of errors per bit of the points in the determination region, or at least any one of combinations thereof. The reference differs in accordance with the repetition index. The reference III is at least one of options defined for the reference II. An output of the algorithm is arrangement of M determination levels (a median of a cluster in each determination region) and a tree structure of 2M−1 nodes. In the MMCVQ algorithm, the node Vj is cut into two new nodes Vi and Vi+1 in each stage. This process ends in a complete binary tree of the 2M−1 nodes. When M=2<N> is selected, the number of nodes in the tree is 2<N+1>−1. Since the tree is not a completed (balanced) tree, the depth of the tree is not limited in accordance with N+1. However, the tree of which the depth is not greater than 2×(N+1) can be guaranteed by appropriately selecting the references. The tree may be further compressed to a complete binary tree of 2<N>−1 nodes rather than 2<N+1>−1. That is, the compressing of the setting information of the determination voltage V implemented using the MMCVQ algorithm is compressing of shift values by stress of a plurality of multidimensional thresholds used when data is read from a storage region corresponding to a row in which there is a flash memory device. The word line string chunk WLSC is a storage region to which bit lines corresponding to a plurality of rows are connected. A table in which patterns of shift values obtained in the MMCVQ are recorded is referred to as a codebook.

<6. Process of Classification Unit>

<6.1 Learning of Classification Unit>

Figure 6:
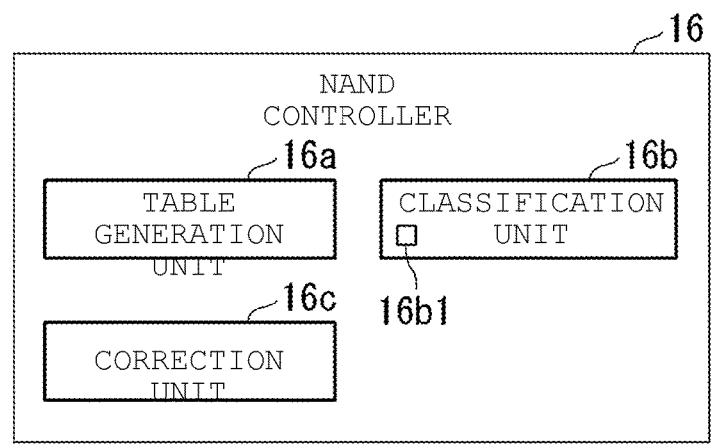
FIG. 6 is a diagram illustrating a configuration of a NAND controller according to the first embodiment.

The memory system 1 according to the first embodiment determines whether the received stress is the read disturb, the data retention, or neither the read disturb nor the data retention in units of word lines based on the distribution of the determination voltage V after reception of the stress, and corrects the determination voltage V in accordance with the determined stress. The phrase that the received stress is neither the read disturb nor the data retention means that a plurality of kinds of stress which may include the read disturb and the data retention are received or one kind of stress (or stress type) or a plurality of kinds of stress (or stress types) which are neither the read disturb nor the data retention are received, and is referred to as "normal" in some cases. FIG. 6 is a diagram illustrating a functional configuration of the NAND controller 16. The NAND controller 16 according to the first embodiment includes a table generation unit 16a, a classification unit 16b, and a correction unit 16c, as illustrated in FIG. 6. The classification unit 16b includes a calculation unit 16b1. The table generation unit 16a, the classification unit 16b, and the correction unit 16c are implemented by causing the NAND controller 16 to execute a program such as firmware. The table generation unit 16a generates a database and a data table. The correction unit 16c corrects the determination voltage V after reception of the stress. A phase in which learning is performed using a database is referred to as offline processing and a phase in which a learned model is applied to actual reading of the NAND memory 20 is referred to as online processing. Here, processes performed by the table generation unit 16a and the classification unit 16b will be described and processes performed by the correction unit 16c will be described later.

The classification unit 16b determines a kind of stress. That is, the classification unit 16b determines whether the stress is the read disturb, the data retention, or neither the read disturb nor the data retention in units of word lines. The classification unit 16b classifies the stress based on, for example, an algorithm such as logistic regression or a support vector machine (SVM).

For example, when a model of the SVM is used, the classification unit 16b is generated through supervised learning. Specifically, as supervised data, shift values of the determination voltage V are accepted as inputs x, past stress actually received on the memory system 1 is output as outputs y with labels (three kinds of read disturb, the data retention, and neither the read disturb nor the data retention) with regard to the input x, and a plurality of combinations of the input x and the output y are prepared. When each input x is input to the model, parameters in the model are determined so that the output y corresponding to the input x is output. The model in which the parameters are determined in this way is a learned model of the classification unit 16b.

For example, when the classification by the classification unit 16b is implemented using an algorithm of logistic regression, an identification function of classifying the stress can be presented in Expression (1) below. The calculation unit 16b1 of the classification unit 16b calculates Expression (1).

[Expression 1]

$$\text{Logit}(p_i) = \ln\left(\frac{p_i}{1-p_i}\right) \quad (1)$$
$$= \alpha + \beta_1 x_{1,i} + \ldots + \beta_k x_{k,i}$$

Here, p is a probability of an output being certain stress. Here, x is an input, and α and β are parameters. Here, i is a number of the word line string chunk WLSC. In addition, i is fixed to 1, that is, each word line string chunk WLSC may be treated as being the same. In addition, as x, a distance between the word line string chunks WLSC may be input for each number i of each word line string chunk WLSC. The distance between the word line string chunks WLSC is a distance from the word line string chunk WLSC of interest to the physically closest word line string chunk WLSC. For example, among a distance between the word line string chunk WLSC0 and the word line string chunk WLSC100 and a distance between the word line string chunk WLSC0 and the word line string chunk WLSC1, a physically closer distance is used for the word line string chunk WLSC0. In this case, the distance from the word line string chunk WLSC to the NAND controller 16 is taken into consideration. Therefore, determination accuracy of the stress output by the classification unit 16b is improved more than when the distance is not taken into consideration.

Figure 7:
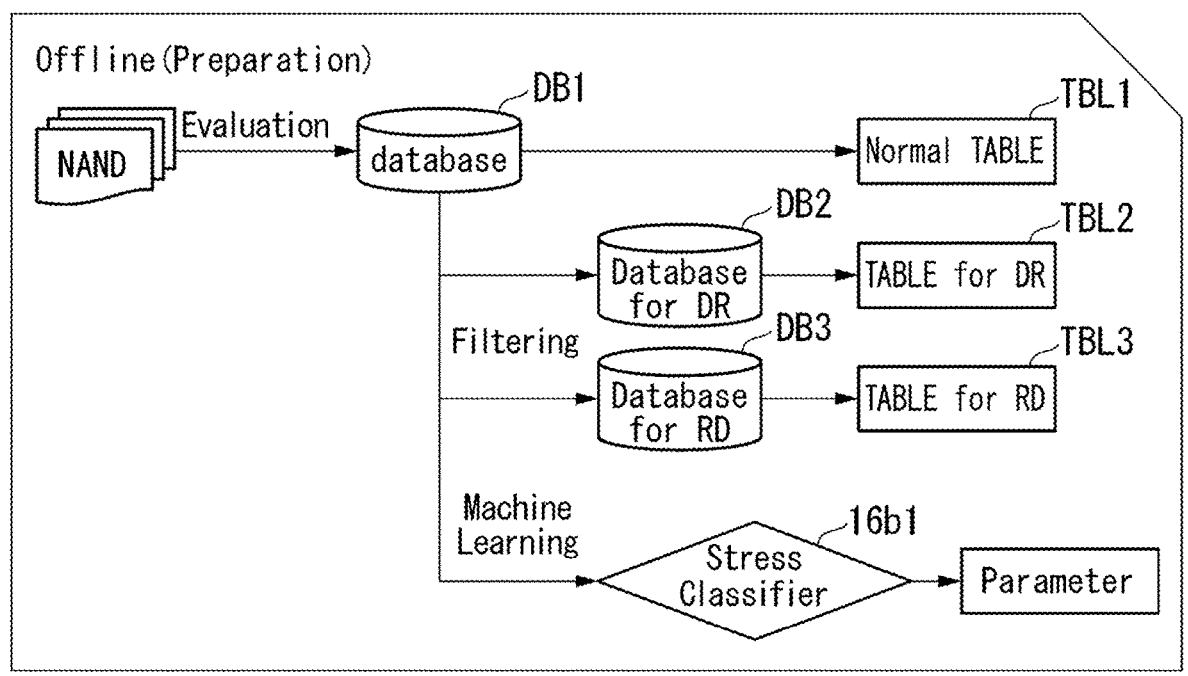
FIG. 7 is a first diagram illustrating an overview of a process performed by the memory system according to the first embodiment.

Here, supervised learning of the classification unit 16b will be described with reference to FIGS. 7 to 9 giving an example of a case where each memory cell MT of the NAND memory 20 operates in the quad-level cell (QLC) mode. FIG. 7 is a diagram illustrating an overview of a process generating the learned classification unit 16b. First, combinations of a plurality of various kinds of stress, rows, and the determination voltages V are recoded in a database DB1. FIG. 8 is a diagram illustrating an example of the database DB1. The database DB1 includes at least stress actually received on the plurality of NAND memories 20 (that is, the data retention and the read disturb), the determination voltage V after reception of the stress, and the initial determination voltage V in which no stress is received, in units of word lines. In FIG. 8, "chip" indicates a number granted to each memory chip 21 in a memory. "Block" indicates a number granted to a block in each "chip". "WLSC" indicates a word line string chunk. "DR" indicates data retention. "P/E" indicates the number of program erasing cycles. "RD" indicates read disturb. "Initial Vth" indicates an initial read threshold voltage. "Actual Vth" indicates a read threshold voltage at a time point at which the data is read. "Level" indicates a level granted in correspondence with the read threshold voltage. The determination voltage V after reception of stress (that is, an equivalence to a shift value of the read threshold voltage from before reception of the stress to after reception of the stress) may be estimated from the shift value acquired using any of various tracking technologies such as quick training (QT) or full level tracking. QT is a technology for estimating a read threshold voltage with high accuracy by performing matrix calculation of a charge amount acquired in sample reading and parameters generated in advance by machine learning (see U.S. Pat. No. 9,069,659). Full level tracking is a technology for performing sample reading many times by shifting a voltage slightly from an initially set read voltage and estimating a charge distribution from information regarding the acquired charge amount.

Specifically, the table generation unit 16a records the kind of received stress and the determination voltage V after reception of the stress when certain stress is received on the NAND memory 20, as a history table, in the database DB1. That is, the table generation unit 16a generates the database DB1. The table generation unit 16a generates a data table TBL1 indicating correction parameters for correcting a difference from an initial value of the determination voltage V for each row using a representative value (for example, an average) of the determination voltage V for each row (described with WLSC in FIG. 8) in the database DB1. FIG. 9 is a diagram illustrating an example of the data table TBL1. In FIG. 9, a value of the row is illustrated as a value of the word line string chunk WLSC. That is, in FIG. 9, rows of 0 to 383 are illustrated as the word line string chunks WLSC of 0 to 383. The data table TBL1 shows a correction value in which a representative value (for example, an average) of each of determination voltages VA to VO is set as a reference with regard to each WLSC. That is, FIG. 9 illustrates differences from the reference values (initial values) of the determination voltages V.

The table generation unit 16a generates a database DB2 for the data retention and a database DB3 for the read disturb from the database DB1. For the data retention includes only data when stress of the data retention is received. For the read disturb includes only data when stress of the read disturb is received. For example, the table generation unit 16a generates the database DB2 and the database DB3 by filtering the database DB1. That is, the table generation unit 16a generates the database DB2 and the database DB3 by dividing data into data related to the data retention and data related to the read disturb. The table generation unit 16a generates the data table TBL2 for the data retention from the database DB2 in a similar method to a method of generating the data table TBL1 from the database DB1. The table generation unit 16a generates the data table TBL3 for the read disturb from the database DB3.

In the offline processing, the classification unit 16b acquires actually received stress and shift values from the determination voltages V before reception of the stress to the determination voltages V after reception of the stress as data with labels from the database DB1 in which various kinds of stress are accumulated, and acquires the shift values as input data and acquires the actually received stress as output data. The classification unit 16b inputs the received shift values to the calculation unit 16b1 using Expression (1) described above. Then, the classification unit 16b determines values of the parameters α and β in Expression (1) and stores the values in the calculation unit 16b1 so that the output data (the stress) corresponding to the input data (the shift values) are obtained. In this way, the learned model, that is, the learned classification unit 16b, is implemented by determining the parameters α and β based on the actually received stress and the shift values corresponding to the stress.

The model of the supervised learning is not limited to the logistic regression. For example, when the algorithm of the SVM is used, the identification function can be expressed in Expression (2) below.

[Expression 2]

$$G(x) = \text{sign}(\beta x + \alpha) \quad (2)$$

Like the case where the algorithm of the logistic regression is used, x is an input in Expression (2). α and β are parameters. A difference between the classification unit 16b using the algorithm of the SVM and the classification unit 16b using the algorithm of the logistic regression is only the identification function, and a parameter generation routine and a method of implementing the learned classification unit 16b classifying the stress (a method of generating the learned model) are the same. The learned model, that is, the learned classification unit 16b, may be any model as long as the model can be implemented on the memory controller 10.

<6.2 Classification of Stress by Learned Classification Unit>

Figure 10:
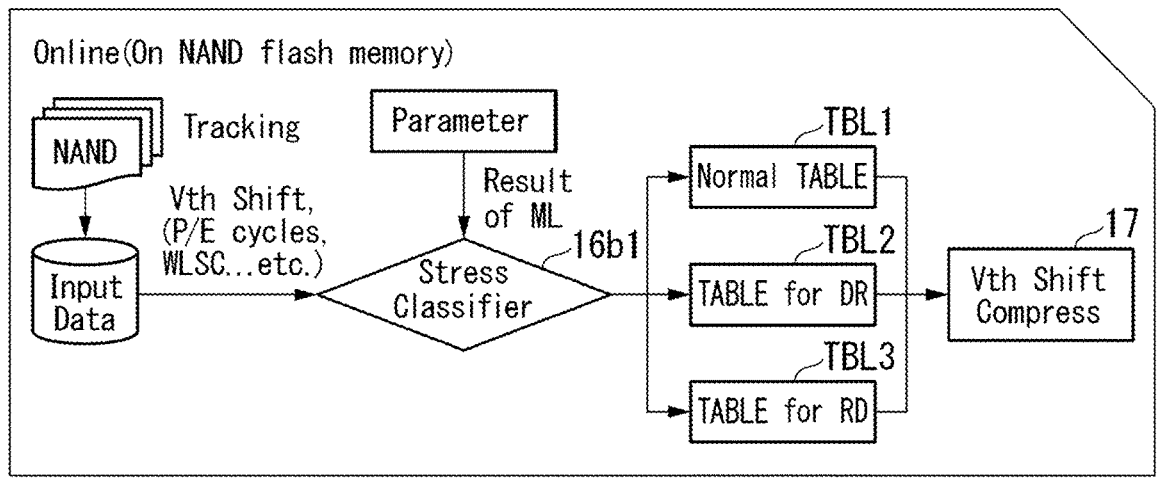
FIG. 10 is a second diagram illustrating an overview of a process performed by the memory system according to the first embodiment.
Figure 11:
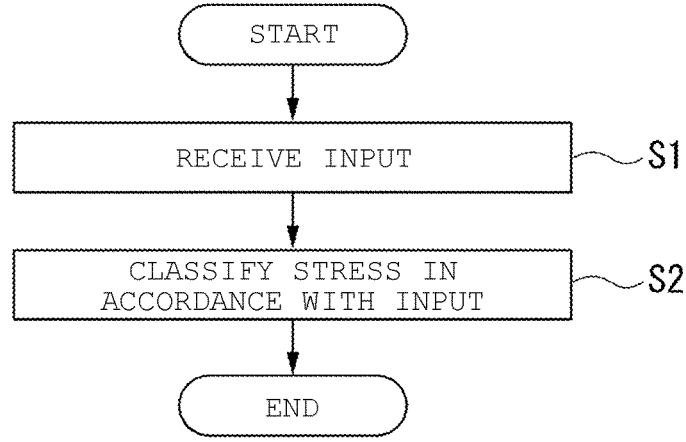
FIG. 11 is a diagram illustrating a processing flow of a classification unit according to the first embodiment.

Next, classification of stress by the learned classification unit 16b will be described with reference to FIGS. 10 and 11. FIG. 10 is a diagram illustrating an overview of a process of classifying stress using the learned classification unit 16b and correcting the read threshold voltage based on a classification result. FIG. 11 is a diagram illustrating a processing flow of the classification of the stress. The process to be described here is online processing by the learned classification unit 16b.

In the online processing, a shift value x (that is, a shift value from an initial read threshold voltage before reception of the stress to a read threshold voltage after reception of the stress) of the determination voltage V is input to the classification unit 16b. For example, when each memory cell MT operates in the quad-level cell (QLC) mode, k in Expression (1) becomes 15. Then, x1, i to x15, and i are input as input data to the classification unit 16b. That is, as illustrated in FIG. 11, the classification unit 16b receives an input x (S1). The classification unit 16b classifies the stress in accordance with the received input (S2). For example, when each memory cell MT operates in the quad-level cell (QLC) mode, the classification unit 16b outputs the read disturb, the data retention, or the normal as output data in accordance with the input x1, i to x15, and i. A process corresponding thereto is performed as follows in FIG. 10. In FIG. 10, when "Stress Classifier" which is the calculation unit 16b1 receives "Input Data," the process of the foregoing S1 is performed. Then, the "Stress Classifier" performs the process of the above-described S2 and outputs the read disturb, the data retention, or the normal as output data.

<7. Process of Correction Unit>

Figure 12:
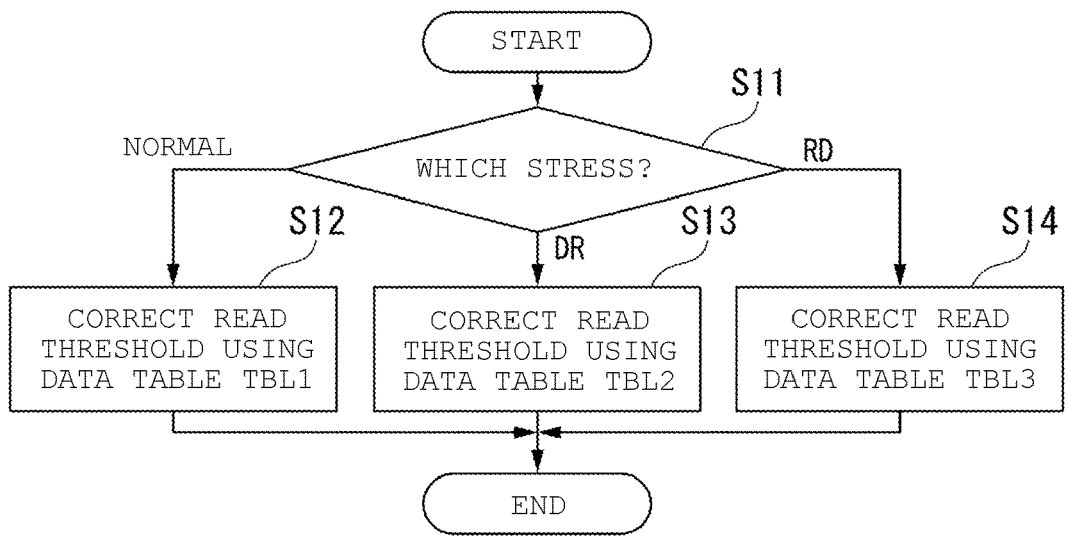
FIG. 12 is a diagram illustrating a processing flow of a correction unit according to the first embodiment.

Next, correction of the read threshold voltage by the correction unit 16c will be described with reference to FIGS. 10 and 12. FIG. 12 is a diagram illustrating a processing flow in which the read threshold voltage is corrected based on a classification result of the stress by the classification unit 16b.

In the online processing, the correction unit 16c determines the classification result of the stress by the classification unit 16b (S11) and corrects the read threshold voltage based on the determination. For example, when the classification unit 16b outputs the normal as the classification result of the stress, the correction unit 16c determines the normal as the classification result ("normal" in S11), selects the data table TBL1 corresponding to the normal, and corrects the read threshold voltage using the shift value indicated in the selected data table TBL1 (S12). When the classification unit 16b outputs the data retention as the classification result of the stress, the correction unit 16c determines the data retention as the classification result ("DR" in S11), selects the data table TBL2 corresponding to the data retention, and corrects the read threshold voltage using the shift value indicated in the selected data table TBL2 (S13). When the classification unit 16b outputs the read disturb as the classification result of the stress, the correction unit 16c determines the read disturb as the classification result ("RD" in S11), selects the data table TBL3 corresponding to the read disturb, and corrects the read threshold voltage using the shift value indicated in the selected data table TBL3 (S14). The setting information of the determination voltage V implemented using the above-described MMCVQ algorithm is compressed. A process corresponding thereto is performed as follows in FIG. 10. In FIG. 10, the process of the foregoing S11 is performed by "Stress Classifier". When the classification result is determined to be the normal, the read threshold voltage is corrected using the shift value indicated in "Normal TABLE" which is the data table TBL1. When the classification result is determined to be the data retention, the read threshold voltage is corrected using the shift value indicated in "TABLE for DR" which is the data table TBL2. When the classification result is determined to be the read disturb, the read threshold voltage is corrected using the shift value indicated in "TABLE for RD" which is the data table TBL3. The setting information of the above-described determination voltage V is compressed by "Vth Shift Compress" 17 illustrated in FIG. 10.

<8. Advantages>

The memory system 1 according to the first embodiment has been described above. In the memory system 1, the classification unit 16b includes a learned model that has the parameters determined based on the shift value from the initial read threshold voltage before reception of the stress to the read threshold voltage after reception of the stress. The classification unit 16b classifies the stress based on the shift value input to the learned model. The correction unit 16c corrects the read threshold voltage after reception of the stress by using the correction value in accordance with the classification result by the classification unit 16b. In the memory system 1 configured in this way, the read threshold voltage can be corrected with the correction value in accordance with the stress after the kinds of stress are classified. Therefore, the read threshold voltage can be corrected with higher accuracy than, for example, when the read threshold voltage after reception of the stress is corrected using only the data table TBL1 of the normal in which the kinds of stress are not classified.

First Modification Example of First Embodiment

In the memory system 1 according to the above-described first embodiment, the classification unit 16b implemented a learned classification unit by using the actually received stress as the output data with labels, using the shift value from the determination voltage V before reception of the stress to the determination voltage V after reception of the stress as input data with labels, performing supervised learning, and determining the parameters α and β. In a first modification example of the first embodiment, the classification unit 16b may be implemented as a learned classified by using the actually received stress as the output data with the labels, performing supervised learning using the threshold voltage as the input data with the labels in accordance with, for example, the number of program erasing cycles (hereinafter referred to as the "number of P/E cycles") in addition to the shaft value from the determination voltage V before reception of the stress to the determination voltage V after reception of the stress, and determining the parameters α and β. The number of P/E cycles is the number of times a process of erasing stored existing data is performed when data is written. In this case, since the number of P/E cycles which is one element having an influence on the threshold voltage is also taken into consideration, the determination accuracy indicating whether the stress output by the classification unit 16b is the read disturb, the data retention, or neither the read disturb nor the data retention is improved more than when supervised learning is performed without using the number of P/E cycles.

Second Modification Example of First Embodiment

In a second modification example of the first embodiment, the classification unit 16b may be implemented a learned classification unit by using the actually received stress as the output data with the labels, performing supervised learning using a bit error rate indicating a rate of an error of read data as input data with labels in addition to the shaft value from the determination voltage V before reception of the stress to the determination voltage V after reception of the stress, and determining the parameters α and β. In this case, for example, Expression (3) below may be used as an identification function.

[Expression 3]

$$\text{Logit}(p_i) = \ln\left(\frac{p_i}{1 - p_i}\right) \quad (3)$$
$$= \alpha + w_1 \beta_1 x_{1,i} + \ldots + w_k \beta_k x_{k,i}$$

Here, w is a weight. In this case, since the bit error rate is considered as the weight w, the determination accuracy indicating whether the stress output by the classification unit 16b is the read disturb, the data retention, or neither the read disturb nor the data retention is improved more than when supervised learning is performed without using the bit error rate. The number of error bits may be used instead of the bit error rate.

Second Embodiment

The memory system 1 according to the first embodiment is a system that determines whether the stress is the read disturb, the data retention, or neither the read disturb nor the data retention. On the other hand, a memory system 1a according to a second embodiment is a system that determines a time at which the stress of the data retention is received using a bit error rate like the memory system 1 according to the first embodiment and simultaneously estimates the strength of the determined stress. The strength of the stress is indicated as a numeral value representing how much the strength of the stress is received. The strength of the stress has a numeral value which increases with an increase in an elapsed time in which the stress is received and indicates that strong stress is received. The memory system 1a includes a NAND controller 161. FIG. 13 is a diagram illustrating a functional configuration of the NAND controller 161 in the memory system 1a according to the second embodiment. As illustrated in FIG. 13, the NAND controller 161 includes a table generation unit 16a1, a classification unit 16b2, and a correction unit 16c. The classification unit 16b2 includes a calculation unit 16b1.

<9. Learning of Classification Unit>

FIG. 14 is a diagram illustrating an overview of a process performed by the memory system 1a when the learned classification unit 16b2 is generated. First, combinations of a plurality of various kinds of stress, rows, and the shift values of the determination voltages VA to VO are recoded in the database DB1 along with the elapsed time. A data table TBL illustrated in FIG. 14 is generated from a part of the data of the database DB1 illustrated in FIG. 8.

The database DB1 and the data table TBL are generated by the table generation unit 16a1. The table generation unit 16a1 generates the database DB1 like the table generation unit 16a according to the first embodiment. The table generation unit 16a1 generates the data table TBL by taking a difference between an initial read threshold voltage and a read threshold voltage at a time point at which the data is read with regard to the data retention in the database DB1.

Thereafter, like the table generation unit 16a according to the first embodiment, the table generation unit 16a1 generates the data table TBL1 indicating correction parameters for correcting a difference from an initial value of the determination voltage V for each row using a representative value (for example, an average) of the determination voltage V for each row in the database DB1. Like the table generation unit 16a according to the first embodiment, the table generation unit 16a1 generates the database DB2 for the data retention and thee database DB3 for the read disturb from the database DB1.

In the offline processing, the classification unit 16b2 acquires the actually received stress and the shift value from the determination voltage V before reception of the stress to the determination voltages VA to VO after reception of the stress as data with labels from the database DB1 in which various kinds of stress are accumulated, and acquires the shift values as input data and acquires an elapsed time in which the actually received stress of the data retention is received as output data. In the learning, the classification unit 16b2 inputs the received shift values to the calculation unit 16b1 using Expression (1) described above. Then, the classification unit 16b2 determines values of the parameters α and β in Expression (1) and stores the values in the calculation unit 16b1 so that the output data (the time of the data retention) corresponding to the input data (the shift values) are output. In this way, the learned model, that is, the learned classification unit 16b2, is implemented by determining the parameters α and β further taking into consideration of a time in which the stress of the data retention is actually received and the shift value corresponding to that time. In the online processing, the classification unit 16b2 classifies the stress like the classification unit 16b according to the first embodiment. The correction unit 16c corrects the read threshold voltage after reception of the stress using the correction value in accordance with a classification result of the classification unit 16b2 like the correction unit 16c according to the first embodiment. In this case, supervised learning is performed using the time of the data retention and the shift values to the determination voltages VA to VO. According to the learned model, in the online processing, the classification unit 16b2 can determine whether the stress is the read disturb, the data retention, or neither the read disturb nor the data retention from the shift values which are the input data and can further determine the elapsed time in which the stress is received with regard to the data retention of the stress, that is, the strength of the stress.

<10. Advantages>

The memory system 1a according to the second embodiment has been described above. In the memory system 1a, the classification unit 16b2 is implemented as the learned classification unit by performing the supervised learning using the time in which the stress of the data retention is received and the shift values to the determination voltages VA to VO. Thus, the classification unit 16b2 can determine whether the stress is the read disturb, the data retention, or neither the read disturb nor the data retention and can further determine the time in which the stress is received with regard to the stress of the data retention. In general, to determine the time in which the stress of the data retention is received, a time measurement function by a counter or the like is necessary. However, when the classification unit $16b2$ determines the data retention, the counter is unnecessary.

Modification Example of Second Embodiment

In the memory system $1a$ according to the above-described second embodiment, the classification unit $16b2$ determines the time in which the stress of the data retention is received using the bit error rate like the memory system 1 according to the first embodiment. In a modification example of the second embodiment, the classification unit $16b$ may determine a combination of a plurality of kinds of stress using the bit error rate. A distribution of the shift values of the read threshold voltage when the stress of the read disturb is received is raised to a positive side further than a distribution of the shift values of the read threshold voltage when the stress of the data retention is received. Therefore, when a memory receives both the stress of the read disturb and the stress of the data retention, it is considered that the read threshold voltage does not take a countermeasure against any stress and the bit error rate is to be raised. Accordingly, based on this idea, the classification unit $16b$ uses the bit error rate for determination of the stress, and determines that there is a high possibility of a plurality of kinds of stress being received when the bit error rate is high and determines that there is a high possibility of only one kind of stress being received when the bit error rate is low. In this case, since whether the plurality of kinds of stress are received or only one kind of stress is received is taken into consideration, determination accuracy indicating whether the stress output by the classification unit $16b$ is the read disturb, the data retention, or neither the read disturb nor the data retention is improved.

Second Modification Example of Second Embodiment

In a second modification example of the second embodiment, the classification unit $16b$ may be implemented as a learned classification unit by performing the supervised learning using the threshold related to the number of P/E cycles as the input data with the labels and determining the parameters. In this case, since the number of P/E cycles is also considered as the stress, the determination accuracy indicating whether the stress output by the classification unit $16b$ is the read disturb, the data retention, or neither the read disturb nor the data retention and determination accuracy of the time in which the stress is received are improved more than when the supervised learning is performed without using the number of P/E cycles.

Third Embodiment

The memory system $1b$ according to the first and second embodiments determines a kind of stress for each word line and corrects the determination voltage V based on a determination result. On the other hand, the memory system $1b$ according to a third embodiment determines a kind of stress for each block and corrects the determination voltage V based on a determined result. Stress assumed in the third embodiment is stress received on a certain massed storage region, such as data retention, read disturb, and a temperature range CT (that is, a difference in temperature between read-time temperature and write-time temperature).

<11. Management of Determination Voltage of Reference Block>

A method of managing the determination voltage V of a reference block RB according to the third embodiment will be described. The reference block RB is a block of a reference for management of the determination voltage V in each group G to be described below. The determination voltage V of the reference block RB is managed using, for example, a difference value with regard to default reference values VAD to VOD of the determination voltage V.

Figures 16, 17:
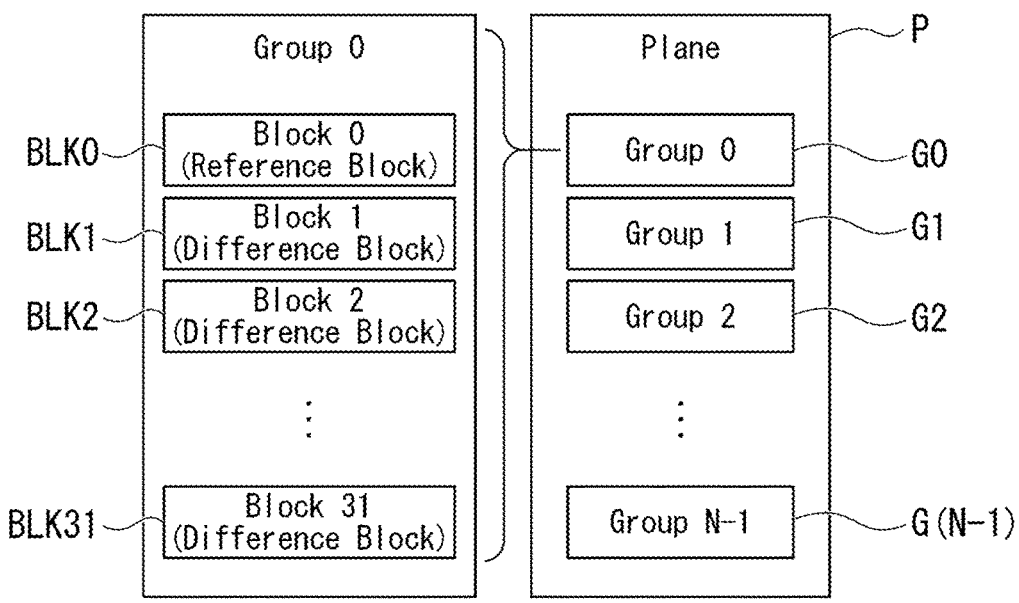
FIG. 16 is a diagram illustrating a relation between a group and a block according to the second embodiment.
FIG. 17 is a diagram illustrating an example of common difference value information according to the second embodiment.

FIG. 15 is a diagram illustrating an example of reference voltage information 110 in the determination voltage information 100 (see FIG. 1). In FIG. 15, values of VAD to VOD indicate reference values (for example, initial setting values) of the determination voltages VA to VO. The values are values indicating the reference values of the determination voltages VA to VO and are indicated by relative levels. The reference voltage information 110 is set to be common (as the same value) to the plurality of memory chips 21. The reference voltage information 110 may be set individually for each memory chip 21, may be provided individually for each plane P, or may be provided individually for each group G. A plurality of groups G are set in one plane P in the memory cell array 41. The plane P is, for example, a region to which continuous access can be made through one channel in the memory cell array 41. FIG. 16 is a diagram illustrating a relation between the group G and the block BLK. Each group G includes a plurality of blocks BLK, as illustrated in FIG. 16. The plurality of blocks BLK in each group G is divided into one reference block RB and a plurality of remaining difference blocks DB. The determination voltages V (VA to VO) of each difference block DB are managed and updated in association with the determination voltages V (VA to VO) of the reference block RB.

FIG. 17 is a diagram illustrating an example of common difference value information 121 included in the correction amount information 120 of the determination voltage information 100 (see FIG. 1). The common difference value information 121 indicates candidates for a difference value (a correction amount or a shift amount) ΔV of the determination voltage V to a certain reference value (for example, an initial value). For example, the common difference value information 121 indicates candidates for the difference value ΔV of the determination voltage V to the default reference values VAD to VOD (or the determination voltages V of the reference block RB as will be described below) of the determination voltages V. In FIG. 17, values of A to O indicate difference values corresponding to the determination voltages VA to VO, respectively. The difference values are added to, for example, the reference values VAD to VOD (or other values) of the determination voltages VA to VO and are used to correct the values of the determination voltages VA to VO. The difference values included in the common difference value information 121 are used commonly to all the word lines WL in an application target block BLK. The number of bits indicating the difference values is less than, for example, the number of bits indicating the reference values VAD to VOD of the determination voltages V included in the reference voltage information 110.

Here, the common difference value information 121 according to the embodiment is not the difference values for necessarily matching the appropriate values of the determination voltages VA to VO with the determination voltages VA to VO. The common difference value information 121 is information obtained by modeling main deviation patterns (hereinafter also referred to as "shift patterns") occurring in the determination voltages VA to VO. In the embodiment, n (where n is a natural number) shift patterns are obtained in advance as the main shift patterns occurring in the determination voltages VA to VO and are registered as candidates. The shift patterns can be obtained in advance, for example, by various mathematical methods, machine learning, or experiments/simulations. For example, the shift patterns can be obtained by performing a data reading operation on the plurality of blocks BLK in advance and applying the MMCVQ algorithm to a database in which the determination voltages V and a bit error rate at that time are recorded.

Hereinafter, to facilitate description, the common difference value information 121 is referred to as "a codebook 121". The codebook 121 is a table in which combinations (shift patterns) of the difference values corresponding to the determination voltages VA to VO and identification numbers called codebook indexes are registered in association. The memory controller 10 can acquire the combinations of the difference values corresponding to the determination voltages VA to VO by designating the codebook indexes. In the embodiments, the number of shift patterns registered in the codebook 121 is 65536. Therefore, the memory controller 10 can acquire various combinations of the difference values corresponding to the determination voltages VA to VO using 16-bit data.

In the third embodiment, for example, the codebook 121 is provided common to the plurality of memory chips 21. The codebook 121 may be provided individually for each memory chip 21 or may be provided individually for each plane P. The certain reference blocks RB (that is, certain blocks BLK) which are associated with certain codebook indexes are registered and managed in block management information 123 to be described below (see FIG. 18).

FIG. 18 is a diagram illustrating an example of the block management information 123 included in the correction amount information 120 of the determination voltage information 100 (see FIG. 1). In the block management information 123, each block BLK (the reference block RB and the difference block DB) is registered in association with a group index of the group G to which the block BLK belongs. Therefore, the memory controller 10 can specify the reference block RB included in the same group G as the target difference block DB with reference to the block management information 123.

FIG. 19 is a diagram illustrating an example of row difference value information 122 included in the correction amount information 120 of the determination voltage information 100 (see FIG. 1). The row difference value information 122 indicates a difference value (a correction amount and a shift amount) ΔV of the determination voltage V with regard to each of the plurality of word lines WL in each block BLK. In FIG. 19, values of A to O indicate difference values corresponding to the determination voltages VA to VO. The difference values are, for example, added to the determination voltages VA to VO of each block BLK acquired using the codebook 121 to be used to correct the values of the determination voltages VA to VO with regard to each word line WL.

Here, the row difference value information 122 is information obtained by modeling main deviation patterns (hereinafter also referred to as "offset patterns" for distinguishment) of the determination voltages VA to VO occurring in each word line WL in each block BLK. In the third embodiment, a classification unit obtained by modeling the offset patterns is the classification unit 16b according to the first or second embodiment. For example, the table generation unit 16a generates the databases DB1 to DB3 and the data tables TBL1 to TBL3 for the blocks by a similar method to the method described with regard to the word line of the first embodiment. Instead of the classification unit 16b obtained through the supervised learning for each word line in the first or second embodiment, the classification unit 16b according to the third embodiment is obtained through the supervised learning for each block. For the offset patterns, a kind of stress is determined by inputting the determination voltages V to the learned classification unit 16b obtained through the supervised learning for each block. The correction unit 16c may correct the offset patterns using the data table TBL2 or the data table TBL3 in accordance with a determination result of the classification unit 16b.

In the third embodiment, the row difference value information 122 is a table in which combinations (offset patterns) of the correction amounts (correction values) corresponding to the determination voltages VA to VO and identification numbers called row indexes are registered in association. The memory controller 10 can acquire the combinations of the difference values corresponding to the determination voltages VA to VO by designating the row indexes corresponding to the target word lines WL. In the embodiment, the number of offset patterns registered in the row difference value information 122 is m (where m is a natural number). Therefore, the memory controller 10 can acquire various combinations of the difference values corresponding to the determination voltages VA to VO using 16-bit data.

Here, the row difference value information 122 has a reference row (a reference word line WL) serving as a reference point of correction. In the example illustrated in FIG. 19, row index 127 corresponds to the reference row. The shift patterns registered in the above-described codebook 121 are shift patterns corresponding to the reference row. Therefore, the determination voltages V corresponding to each word line WL are obtained by further adding the difference values registered in the row difference value information 122 to the difference values registered in the codebook 121.

In the embodiment, for example, the row difference value information 122 is provided common to the plurality of memory chips 21. The row difference value information 122 may be provided individually for each memory chip 21, may be provided individually for each plane P, may be provided individually for each group G, or may be provided individually for each block BLK. In the row difference value information 122, the row index corresponds to, for example, an identification number of the word line WL (hereinafter also referred to as a "word line number"). In other words, in the row difference value information 122, the plurality of offset patterns are registered and arranged mechanically in order of the word line numbers. Therefore, based on the word line number of a certain word line WL, an offset pattern corresponding to the word line WL can be acquired. Instead of this, the certain word lines WL which are associated with certain row indexes may be registered and managed in management information (not illustrated) included in the correction amount information 120.

Figure 20:
FIG. 20 is a diagram illustrating a method of acquiring a determination voltage to be applied to one word line in a difference block according to the second embodiment.

FIG. 20 is a diagram illustrating a method of acquiring the determination voltages VA to VO to be applied to word line WL0 of the reference block RB of group G0. An example illustrated in FIG. 20 is an example in which the reference block RB of group G0 is registered in association with a codebook index n and word line WL0 is registered in association with row index 0.

In this case, the memory controller 10 adds difference values [2, −5, −7, −10, −12, −14, −17, . . . , −23] obtained by designating the codebook index m with reference of the codebook 121 to reference values [25, 84, 138, 195, 258, 322, 392, ..., 1022] obtained with reference to the reference voltage information 110 and further adds difference values [10, 12, 12, 12, 15, 16, 11, ..., 20] obtained by designating row index 0 with reference to the row difference value information 122. Thus, the memory controller 10 acquires the determination voltages VA to VO expressed as [37, 91, 143, 197, 261, 324, 386, ..., 1019].

Figure 21:
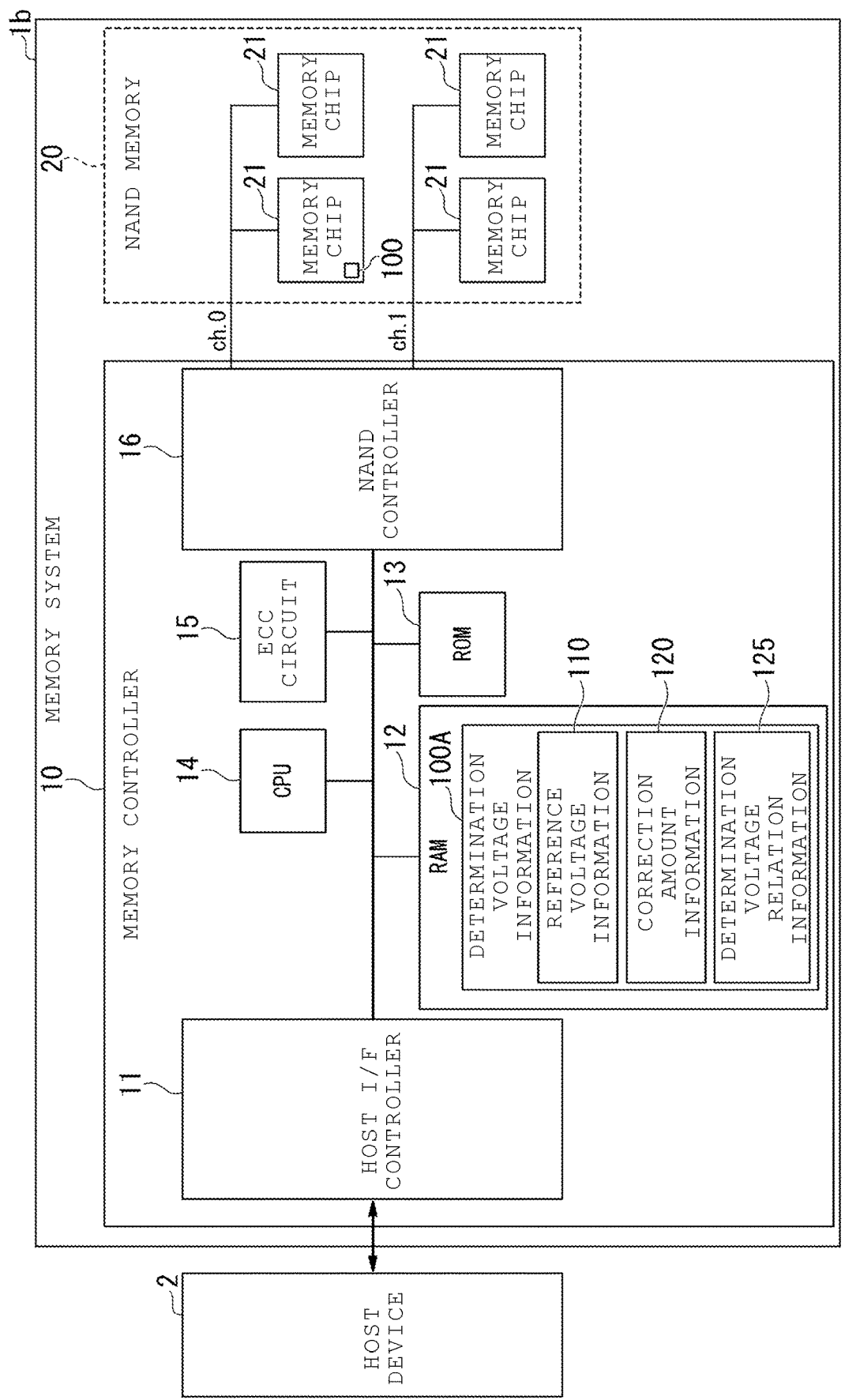
FIG. 21 is a block diagram illustrating a configuration of a memory system according to a third embodiment.

FIG. 21 is a block diagram illustrating a configuration of the memory system 1b according to the third embodiment. In the third embodiment, determination voltage information 100A includes determination voltage relation information 125. The determination voltage relation information 125 will be described later.

Figure 22:
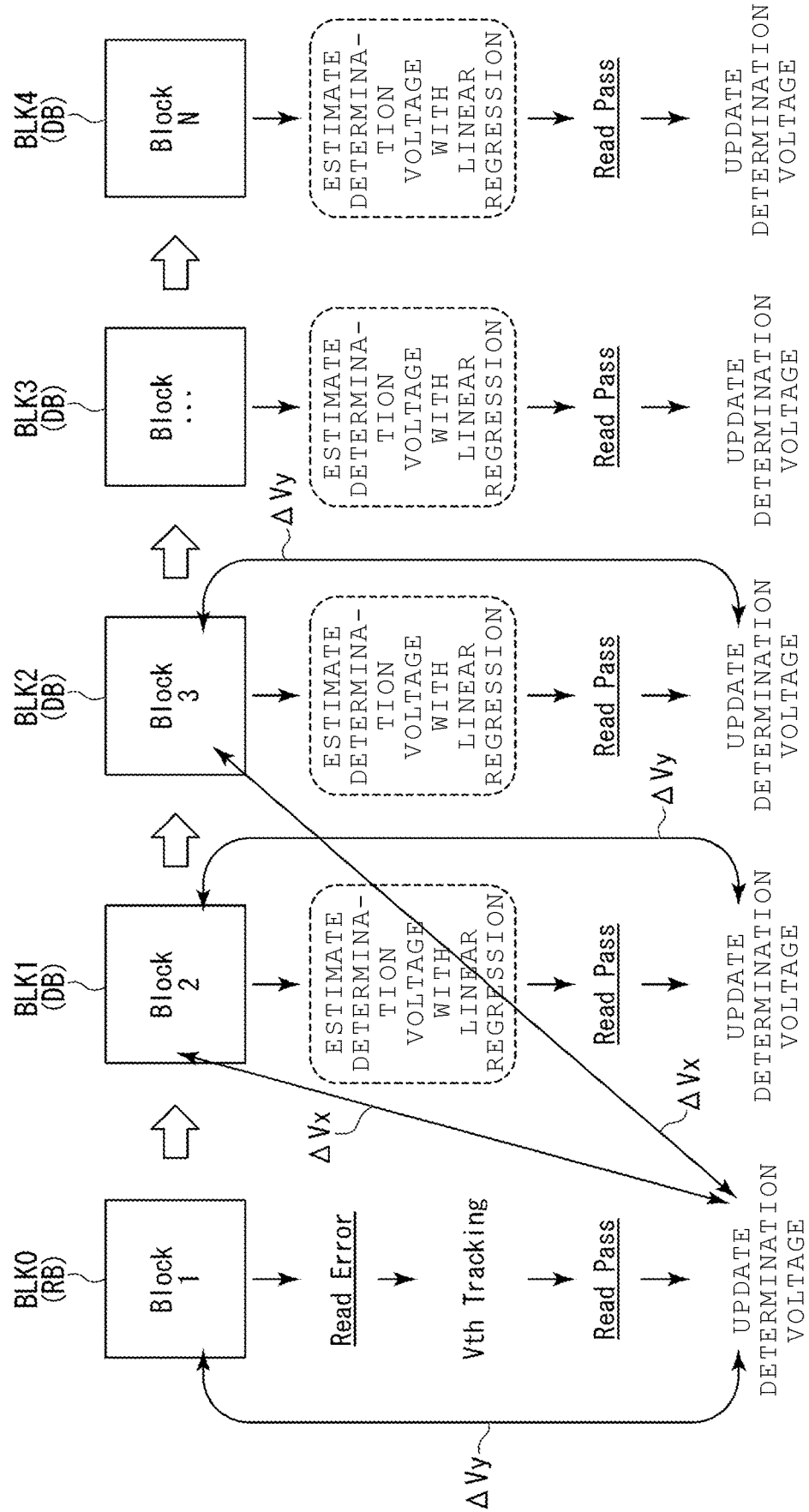
FIG. 22 is a diagram conceptually illustrating a method of managing a block difference value according to the third embodiment.

FIG. 22 is a diagram conceptually illustrating a method of managing block difference values according to the third embodiment. When Vx is a difference value between the determination voltage V of the reference block RB and the determination voltage V of the difference block DB, a change amount Vy of the determination voltage of each block BLK can be expressed in Expression (4) below.

[Expression 4]

$$V_y = \alpha \times V_x + \beta \quad (4)$$

Here, α and β are hyperparameters and can be calculated through machine learning based on a database in which differences in the determination voltages V between the plurality of blocks BLK are actually recorded. That is, as illustrated in FIG. 22, when block BLK0 is set as a reference block RB, the determination voltages V of the plurality of difference blocks DB of blocks BLK1 to BLK(N−1) can be estimated by considering the change amount Vy expressed in Expression (4) in the determination voltages in Expression (1) above described without performing a reading operation (threshold voltage tracking) on each difference block DB. The threshold voltage tracking is a process of searching for a position of a trough in a threshold voltage distribution of the memory cells MT. Specifically, in the threshold voltage tracking, the threshold voltage distribution of the memory cells MT is obtained by performing shift reading in which reading is repeated while shifting a read voltage at a particular step width.

Specifically, the memory controller 10 determines that a read error occurs when the number of error bits or a bit error rate is equal to or greater than a threshold voltage value (for example, the number of error bits exceeds correction performance of the ECC circuit 15) in a reading operation for a certain block BLK (which may be the reference block RB or the difference block DB). In the determination, the memory controller 10 performs threshold voltage tracking (Vth Tracking) on the reference block RB in the group G including the certain block BLK and detects an appropriate value of the determination voltage V. The supervised learning is performed on the classification unit 16b in units of blocks, as described above, so that a label is attached to data obtained in this way and the data retention, the temperature range CT, or the normal is output as stress corresponding to the determination voltage V, and thus the learned classification unit is provided.

When the determination voltage V of each block is input to the learned classification unit 16b implemented in this way, the learned classification unit 16b can determine a kind of stress corresponding to the determination voltage. The correction unit 16c corrects the determination voltage V of the reference block RB in units of blocks using the data table TBL2 or the data table TBL3 corresponding to the stress determined by the classification unit 16b.

Subsequently, the memory controller 10 derives an appropriate value of the determination voltage V of each difference block DB in the same group G based on an appropriate value of the determination voltage V of a newly obtained reference block RB using the determination voltage relation information 125 (see FIG. 21). Here, the determination voltage relation information 125 is information in which a relation between the appropriate value of the determination voltage V of the reference block RB and the appropriate value of the determination voltage V of each difference block DB is obtained through machine learning. For example, the determination voltage relation information 125 includes the above-described Expression (1) and the hyperparameters α and β related to each difference block DB.

From the above-described Expression (1), the memory controller 10 determines stress which the reference block RB receives. From the determination result, the memory controller 10 determines the hyperparameters α and β for obtaining the appropriate value of the determination voltage V of the difference block DB receiving the stress. That is, the memory controller 10 calculates the appropriate value of the determination voltage V of each difference block DB based on the determination voltage V of the newly obtained reference block RB, Expression (1), and the hyperparameters α and β. Then, the memory controller 10 performs a reading operation on each difference block DB using the calculated determination voltage V.

When the reading of the data on each difference block DB is normally performed (when the number of error bits or the bit error rate is less than the threshold value), the memory controller 10 updates the block difference value of the difference block DB based on the calculated determination voltage V.

Specifically, the memory controller 10 performs the threshold voltage tracking to detect the appropriate value of the determination voltage V for one word line WL of the specific difference block DB. The memory controller 10 acquires the appropriate values (shift amounts from the reference values VAD to VOD) of the determination voltages V based on the obtained threshold voltage distribution of the memory cells MT.

Subsequently, with reference to the row difference value information 122, the memory controller 10 acquires a row difference value corresponding to the row index of the word line WL on which the threshold voltage tracking is performed. Subsequently, the memory controller 10 subtracts the row difference value from the acquired shift amount. Thus, the shift amount of the block BLK on which the threshold voltage tracking is performed is acquired.

Subsequently, with reference to the codebook 121, the memory controller 10 acquires a difference value (a group difference value) of the reference block RB of the same group G as the specific difference block DB. Then, the memory controller 10 subtracts the group difference value from the acquired shift amount. Thus, the memory controller acquires an appropriate difference value (a block difference value) of the specific difference block DB from the reference block RB.

Subsequently, the memory controller 10 newly selects a shift pattern approximate to the acquired block difference value among 65536 shift patterns registered in the codebook 121 and specifies a codebook index corresponding to the selected shift pattern. Then, the memory controller 10 substitutes the codebook index of the specific difference block DB with the newly specified codebook index in the block management information 123. Thus, the difference value of the specific difference block DB is changed without changing the difference value of the reference block RB.

The memory controller 10 according to the third embodiment is an example of a classification unit, an example of a correction unit, and an example of a processing unit.

<12. Advantages>

The memory system 1b according to the third embodiment has been described above. As the classification unit 16b of the memory system 1b, the learned classification unit is implemented by performing the supervised learning using the data retention, the temperature range CT, and the shift value. The classification unit 16b estimates stress in units of blocks. Thus, the classification unit 16b can determine whether the stress is the data retention, the temperature range CT, or neither the data retention nor the temperature range CT. As a result, it is possible to determine a kind of stress in units of blocks, and it is possible to correct the determination voltage V for each block using the correction value corresponding to the determined stress.

The several embodiments and modification examples have been described above, but embodiments are not limited to the foregoing examples. The above-described embodiments and modification examples may be combined with each other. Some or all of the functions of the memory controller 10 may be implemented by hardware (including circuitry) such as an application specific integrated circuit (ASIC), a programmable logic device (PLD), or a field programmable gate array (FPGA). In the present specification, ordinary numbers such as "first" and "second" are used to facilitate description and the order may be exchanged.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A memory system comprising:
    a memory including at least a first memory cell and a second memory cell; and
    a controller configured to determine a first stress type that the first memory cell received or a second stress type that the second memory cell received based on a change amount between a first read threshold voltage to read data from the first memory cell when having received stress, and a second read threshold voltage to read data from the first memory cell when having received no stress.

2. The memory system according to claim 1, wherein the controller is configured to determine the first stress type or the second stress type using a function indicating a relation between the stress and the change amount.

3. The memory system according to claim 1, wherein the controller is configured to determine the first stress type or the second stress type based on the change amount and an error value of data read from the first memory cell when having received the stress.

4. The memory system according to claim 3, wherein the error value includes a bit error rate or the number of error bits.

5. The memory system according to claim 1, wherein the controller is configured to determine the first stress type or the second stress type based on the change amount and the number of program erasing cycles performed on the first memory cell.

6. The memory system according to claim 1, wherein the controller is configured to acquire the change amount by tracking threshold voltages of a plurality of memory cells including at least the first memory cell.

7. The memory system according to claim 1,
    wherein the memory includes a first block that includes a plurality of memory cells including the first memory cell, and a second block that includes a plurality of memory cells including the second memory cell and is different from the first block, and
    the controller is configured to change a read threshold voltage of the second block based on the change amount of a read threshold voltage of the first block, and determine a stress type of the plurality of memory cells in the second block.

8. The memory system according to claim 1,
    wherein the memory includes a block including a plurality of memory cells and word lines connected to the plurality of memory cells, and
    the controller is configured to determine the first stress type or the second stress type for each word line or each block.

9. The memory system according to claim 1, wherein the controller is configured to correct the first read threshold voltage based on a correction value in accordance with the determined stress type.

10. A method of controlling a memory system that includes a memory including at least a first memory cell and a second memory cell, the method comprising:
    determining a first stress type that the first memory cell received or a second stress type that the second memory cell received based on a change in a read threshold voltage corresponding to the first memory cell when having received stress.

11. The method according to claim 10, further comprising:
    determining the first stress type or the second stress type using a function indicating a relation between the stress and the change amount.

12. The method according to claim 10, further comprising:
    determining the first stress type or the second stress type based on the change amount and an error value of data read from the first memory cell when having received the stress.

13. The method according to claim 12, wherein the error value includes a bit error rate or the number of error bits.

14. The method according to claim 10, further comprising:
    determining the first stress type or the second stress type based on the change amount and the number of program erasing cycles performed on the first memory cell.

15. The method according to claim 10, further comprising:
    acquiring the change amount by tracking threshold voltages of a plurality of memory cells including at least the first memory cell.

16. The method according to claim 10, wherein the memory includes a first block that includes a plurality of memory cells including the first memory cell, and a second block that includes a plurality of memory cells including the second memory cell and is different from the first block, the method further comprising:
changing a read threshold voltage of the second block based on the change amount of a read threshold voltage of the first block, and determining a stress type of the plurality of memory cells in the second block.

17. The method according to claim 10, wherein the memory includes a block including a plurality of memory cells and word lines connected to the plurality of memory cells, the method further comprising:
determining the first stress type or the second stress type for each word line or each block.

18. The method according to claim 10, further comprising:

correcting the read threshold voltage based on a correction value in accordance with the determined stress type.

* * * * *